(12) United States Patent
Wada

(10) Patent No.: US 11,626,375 B2
(45) Date of Patent: Apr. 11, 2023

(54) SEMICONDUCTOR MEMORY DEVICE

(71) Applicant: Kioxia Corporation, Tokyo (JP)

(72) Inventor: Hideo Wada, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 4 days.

(21) Appl. No.: 17/304,057

(22) Filed: Jun. 14, 2021

(65) Prior Publication Data

US 2022/0270992 A1   Aug. 25, 2022

(30) Foreign Application Priority Data

Feb. 24, 2021 (JP) ............................. JP2021-027174

(51) Int. Cl.
| | | |
|---|---|---|
| H01L 25/065 | (2006.01) | |
| H01L 23/00 | (2006.01) | |
| H01L 25/18 | (2023.01) | |
| H01L 25/00 | (2006.01) | |

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ..................... H01L 24/08; H01L 24/80; H01L 2224/80895; H01L 2224/80896; H01L 25/0657; H01L 25/18; H01L 25/50; H01L 2224/08145; H01L 2924/1431; H01L 2924/14511

See application file for complete search history.

(56) References Cited

U.S. PATENT DOCUMENTS

| | | | |
|---|---|---|---|
| 2016/0079164 A1 | 3/2016 | Fukuzumi et al. | |
| 2019/0088676 A1 | 3/2019 | Tagami et al. | |
| 2022/0084970 A1* | 3/2022 | Tomimatsu | ............. H01L 24/80 |

FOREIGN PATENT DOCUMENTS

JP 2016-062901 A 4/2016

* cited by examiner

*Primary Examiner* — Thanh Y. Tran
(74) *Attorney, Agent, or Firm* — Oblon, McClelland, Maier & Neustadt, L.L.P.

(57) ABSTRACT

A semiconductor memory device includes: a stack above a peripheral circuit on a first substrate, in which first conductive layers and first insulation layers are alternately stacked in a first direction each; a first pillar through the stack, in which a semiconductor layer and each first conductive layer form a memory cell at their intersection; a second substrate including a first region above the stack and the first pillar, being connected to a semiconductor layer, and a second region juxtaposed with the first region in a second direction; a second insulation layer through the second substrate, insulating the regions from each other; and a second conductive layer including a first portion through the second substrate, and a second portion extending in the second direction above the second substrate and including a part defining a bonding pad. The second portion overlaps with the second insulation layer in the first direction.

11 Claims, 17 Drawing Sheets

SEMICONDUCTOR MEMORY DEVICE

CROSS-REFERENCE TO RELATED APPLICATION

This application is based upon and claims the benefit of priority from Japanese Patent Application No. 2021-027174, filed on Feb. 24, 2021; the entire contents of which are incorporated herein by reference.

FIELD

Embodiments disclosed herein relate to a semiconductor memory device.

BACKGROUND

In recent years, a known example of semiconductor memory devices can be formed by bonding a chip in which a memory cell arrays are formed and a chip in which peripheral circuits are formed.

DETAILED DESCRIPTION

Figure 1:
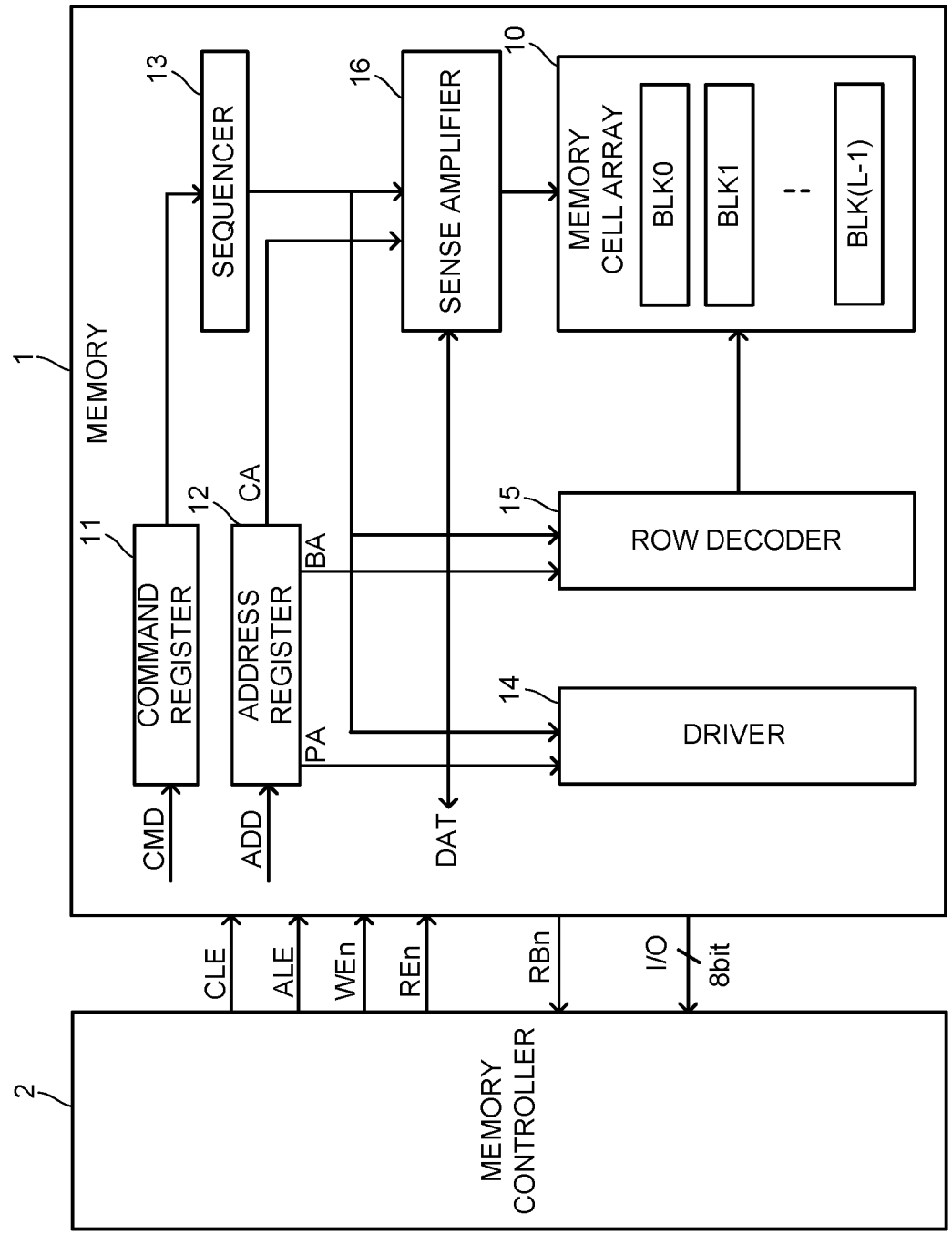
FIG. 1 is a block diagram illustrating a configuration example of a semiconductor memory device.

A semiconductor memory device of an embodiment, includes: a first substrate; a peripheral circuit provided on the first substrate; a stack provided above the peripheral circuit and including first conductive layers and first insulation layers, each first conductive layer and each first insulation layer being alternately stacked in a first direction; a first pillar penetrating through the stack in the first direction and including a semiconductor layer, the semiconductor layer and the each first conductive layer forming a memory cell at an intersection therebetween; a second substrate including a first region and a second region, the first region being provided above the stack and the first pillar and being electrically connected to the semiconductor layer, and the second region being juxtaposed with the first region in a second direction intersecting with the first direction; a second insulation layer penetrating through the second substrate in the first direction, extending in a third direction intersecting with the first direction and with the second direction, and electrically insulating the first and second regions from each other; and a second conductive layer including a first portion and a second portion, the first portion penetrating through the second substrate in the first direction, the second portion extending in the second direction above the second substrate, and the second portion including a part defining a bonding pad. The second portion overlaps with the second insulation layer in the first direction.

Embodiments will be hereinafter explained with reference to the drawings. A relation between the thickness and planar dimension of each of components illustrated in the drawings, a thickness ratio among the components, and so on may be different from actual ones. Further, in the embodiments, substantially the same components are denoted by the same reference signs and an explanation thereof may be partly omitted.

FIG. 1 is a block diagram illustrating a configuration example of a semiconductor memory device. The semiconductor memory device includes a memory 1 and a memory controller 2.

The memory 1 includes a memory cell array 10, a command register 11, an address register 12, a sequencer 13, a driver 14, a row decoder 15, and a sense amplifier 16.

The memory cell array 10 includes a plurality of blocks BLK (BLK0 to BLK(L−1) (L is a natural number of 2 or more). The blocks BLK are each a set of a plurality of memory transistors MT which store data in a nonvolatile manner.

The memory cell array 10 is connected to the sense amplifier 16 via a plurality of bit lines BL, the bit line BL being explained below. The memory cell array 10 includes a plurality of word lines WL and is connected to the row decoder 15 via the plurality of word lines WL as will be explained below. The memory transistors MT (memory cells) are each connected to one of the plurality of word lines WL and one of the plurality of bit lines BL.

The command register 11 holds a command signal CMD received from the memory controller 2. Examples of the command signal CMD include command data causing the sequencer 13 to execute a read operation, a write operation, and an erase operation.

The address register 12 holds an address signal ADD received from the memory controller 2. Examples of the address signal ADD include a block address BA, a page address PA, and a column address CA. The block address BA, the page address PA, and the column address CA can be respectively used for selecting a block BLK, a word line WL, and a bit line BL.

The sequencer 13 controls the operation of the memory 1. For example, the sequencer 13 controls the driver 14, the row decoder 15, the sense amplifier 16, and so on in accordance with the command signal CMD held in the command register 11 to execute the operations such as the read operation, the write operation, and the erase operation.

The driver 14 generates a voltage used for an operation such as the read operation, the write operation, or the erase operation. For example, the driver 14 applies the generated voltage to a signal line corresponding to the word line WL selected based on the page address PA held in the address register 12.

Based on the block address BA held in the address register 12, the row decoder 15 selects a corresponding one of the blocks BLK in the memory cell array 10. Then, for example, the row decoder 15 transfers the voltage applied to the signal line corresponding to the selected word line WL, to the selected word line WL in the selected block BLK.

In the write operation, the sense amplifier 16 applies a desired voltage to each bit line BL according to write data DAT received from the memory controller 2. Further, in the read operation, the sense amplifier 16 determines data stored in the memory cell in response to the voltage of the bit line BL and transfers the determination result as read data DAT to the memory controller 2.

The communication between the memory 1 and the memory controller 2 supports the NAND interface protocol, for instance. For example, the communication between the memory 1 and the memory controller 2 uses a command latch enable signal CLE, an address latch enable signal ALE, a write enable signal WEn, a read enable signal REn, a ready/busy signal RBn, and an input/output signal I/O.

The command latch enable signal CLE indicates that an input/output signal I/O received by the memory 1 is a command signal CMD. The address latch enable signal ALE indicates that a received signal I/O is an address signal ADD. The write enable signal WEn is a signal that commands the memory 1 to receive an input/output signal I/O. The read enable signal REn is a signal that commands the memory 1 to output an input/output signal I/O.

The ready/busy signal RBn is a signal that notifies the memory controller 2 whether the memory 1 is in a ready state in which it accepts a command from the memory controller 2 or is in a busy state in which it does not accept a command.

The input/output signal I/O is a signal with, for example, an eight-bit width, and can include signals such as the command signal CMD, the address signal ADD, and the write data signal DAT.

A combination of the memory 1 and the memory controller 2 explained above may form one semiconductor memory device. Examples of such a semiconductor memory device include a memory card such as an SD card, and a solid state drive (SSD).

Figure 2:
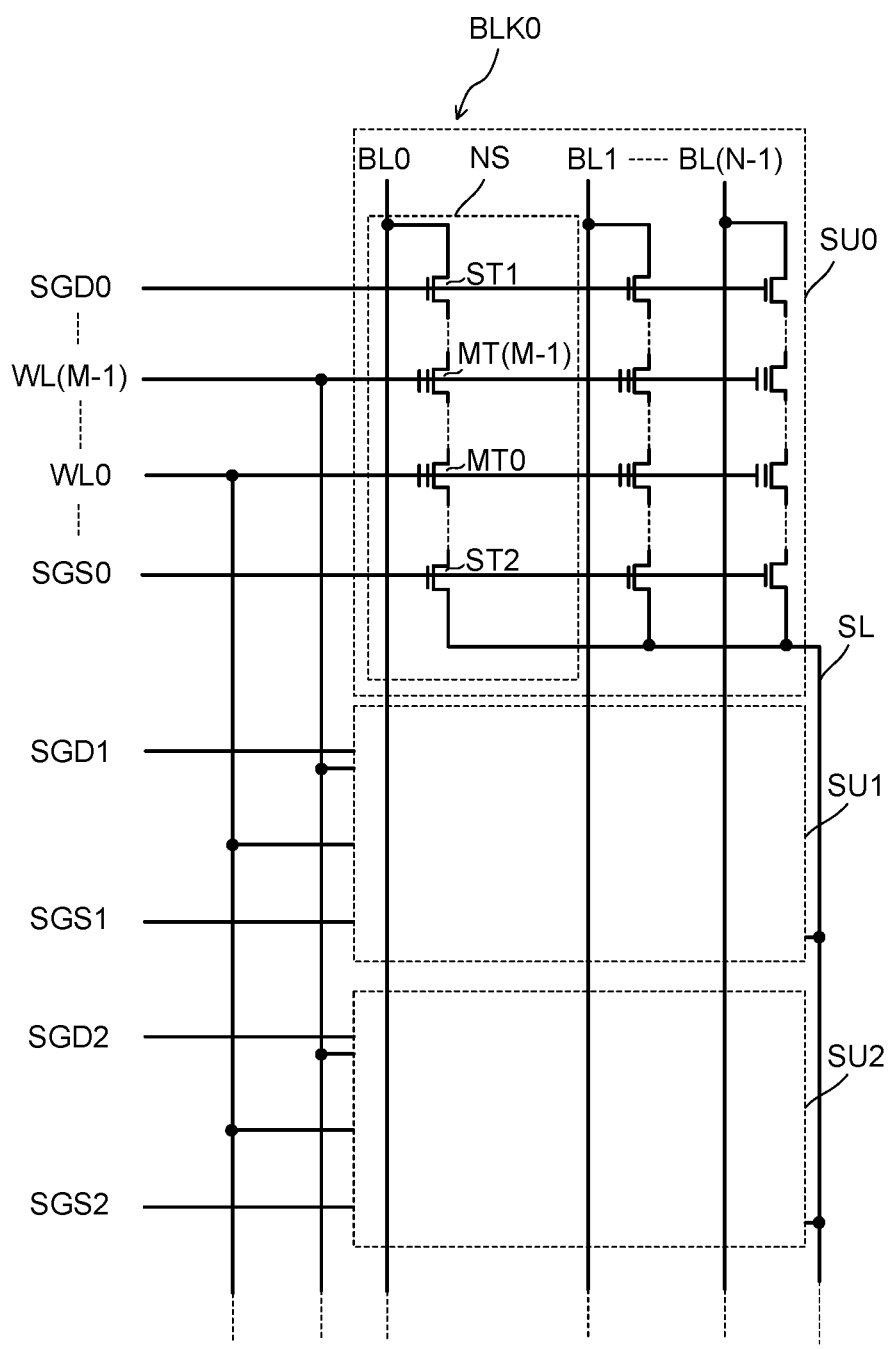
FIG. 2 is a circuit diagram illustrating a circuit configuration of a memory cell array.

Next, a circuit configuration example of the memory cell array 10 will be explained. FIG. 2 is a circuit diagram illustrating the circuit configuration of the memory cell array 10. FIG. 2 illustrates the block BLK0 as an example, and the configurations of the other blocks BLK are also the same.

The block BLK includes a plurality of string units SU. The string units SU each include a plurality of NAND strings NS. FIG. 2 illustrates three string units SU (SU0 to SU2), but the number of the string units SU is not particularly limited.

The NAND strings NS are each connected to one of the plurality of bit lines BL (BL0 to BL(N−1) (N is a natural number of 2 or more)). Each NAND string NS includes the memory transistors MT, a select transistor ST1, and a select transistor ST2.

Each memory transistor MT includes a control gate and a charge storage layer and hold data in a nonvolatile manner. FIG. 2 illustrates a plurality of memory transistors MT (MT0 to MT(M−1) (M is a natural number of 2 or more)), but the number of the memory transistors MT is not particularly limited. Each NAND string NS may include at least one dummy memory transistor, the least one dummy memory transistor has the same structure as the structure of the memory transistor MT, but the least one dummy memory transistor being not used for holding data.

Each memory transistor MT may be a MONOS type memory transistor or an FG type memory transistor, the MONOS type memory transistor including an insulation film as a charge storage layer, the FG type memory transistor including a conductor layer as a charge storage layer. Hereinafter, the MONOS type memory transistor will be explained as an example in this embodiment.

The select transistor ST1 is used for selecting a string unit SU at the time of the various operations. The number of the select transistors ST1 is not particularly limited.

The select transistor ST2 is used for selecting a string unit SU at the time of the various operations. The number of the select transistors ST2 is not particularly limited.

In each NAND string NS, a drain of the select transistor ST1 is connected to the corresponding one of the bit lines BL. A source of the select transistor ST1 is connected to one end of the serially connected memory transistors MT. The other end of the serially connected memory transistors is connected to a drain of the select transistor ST2.

In the same block BLK, the sources of the select transistors ST2 are connected to a source line SL. Gates of the select transistors ST1 of the string units SU are connected to corresponding ones of select gate lines SGD respectively. Control gates of the memory transistors MT are connected to corresponding ones of the word lines WL respectively. Gates of the select transistors ST2 are connected to corresponding ones of select gate lines SGS respectively.

In the plurality of blocks BLK, the plurality of NAND strings NS assigned the same column address CA are connected to the same bit line BL. The source line SL is connected among the plurality of blocks BLK.

First Example of Memory 1

Figure 3:
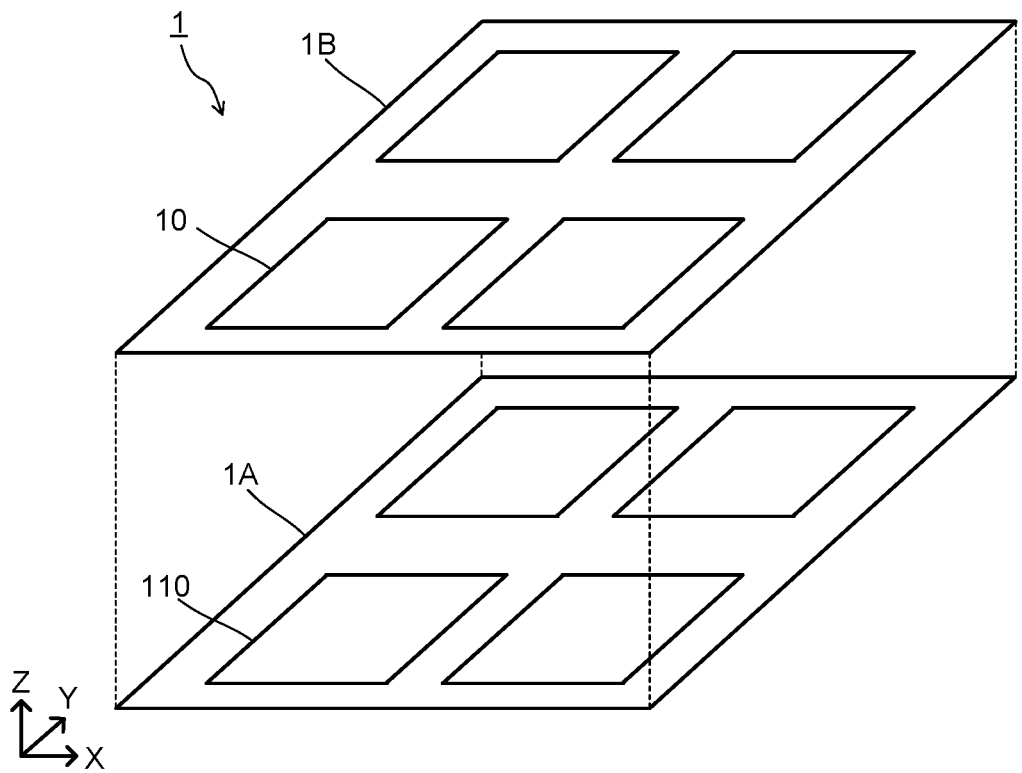
FIG. 3 is a schematic view for explaining a first example of a memory 1.

FIG. 3 is a schematic view for explaining a first example of the memory 1. FIG. 3 illustrates an X-axis direction along a direction of a surface of a chip, a Y-axis direction perpendicular to an X-axis, and a Z-axis direction substantially perpendicularly intersecting with the X-axis and a Y-axis. The structure of the memory 1 is not limited to the structure of the first example.

The memory 1 illustrated in FIG. 3 includes a chip 1A and a chip 1B. The chip 1A and the chip 1B are joined to each other to form a chip bonding array (CBA) structure.

The chip 1B includes the memory cell array 10. In the example of FIG. 3, the memory 1 is a four-plane structure and has four memory cell arrays 10, but the number of memory cell arrays 10 (the number of planes) is not limited to the number illustrated in FIG. 3.

The chip 1A includes at least one peripheral circuit 110 selected from the group consisting of the command register 11, the address register 12, the sequencer 13, the driver 14, the row decoder 15, and the sense amplifier 16. FIG. 3 illustrates an example in which the chip 1B has four peripheral circuits 110 correspondingly to the number of memory cell arrays 10, but the number of peripheral circuits 110 only needs to correspond to the number of memory cell arrays 10 and is not limited to the number illustrated in FIG. 3. Each of the peripheral circuits 110 controls the corresponding memory cell array 10. Each of the peripheral circuits 110 overlaps with the corresponding memory cell array 10 as viewed in a Z-direction.

Figure 4:
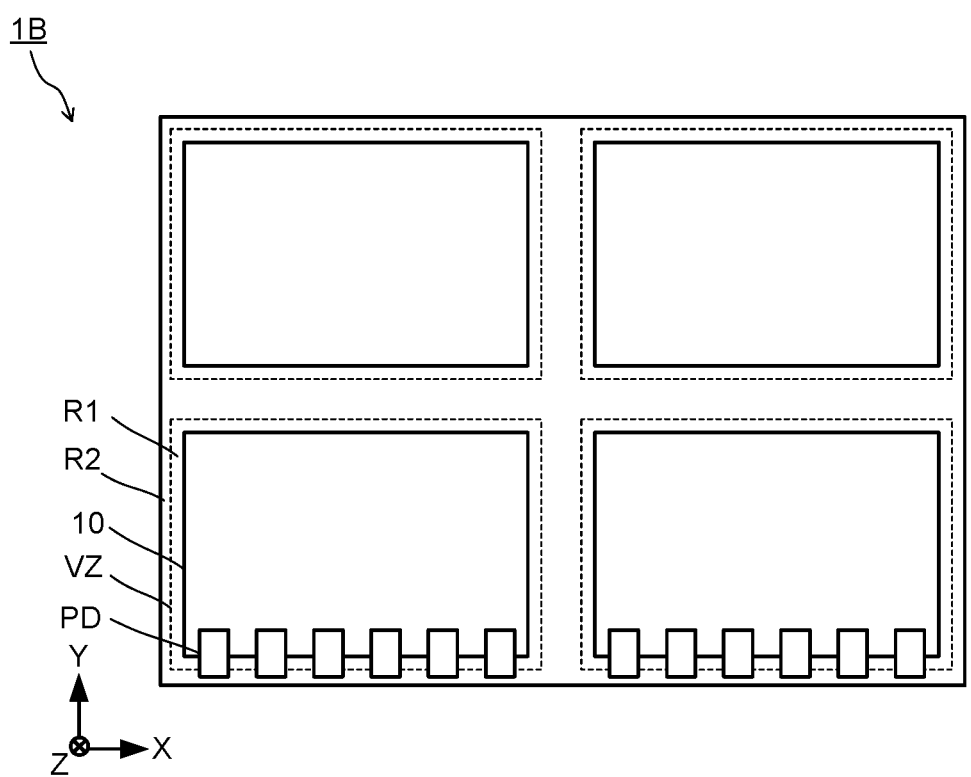
FIG. 4 is a planar schematic view illustrating a structure example of a chip 1B.

FIG. 4 is a planar schematic view illustrating a structure example of the chip 1B and illustrates an X-Y plane. The chip 1B has regions R1 including the memory cell arrays 10, a region R2 provided around the regions R1, and an insulation separator VZ electrically insulating the regions R1 from the region R2. As illustrated in FIG. 4, the insulation separator VZ is provided to surround, for example, the regions R1. The plurality of regions R1 are electrically insulated from one another by the insulation separator VZ.

Figure 5:
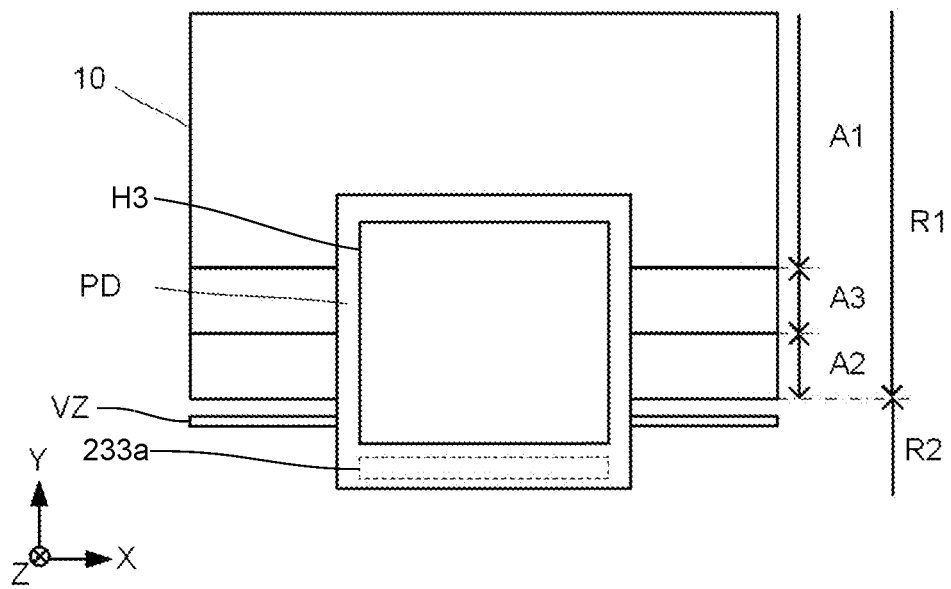
FIG. 5 is a planar schematic view illustrating a part of the chip 1B illustrated in FIG. 4.

FIG. 5 is a planar schematic view illustrating a part of the chip 1B illustrated in FIG. 4 and illustrates the X-Y plane. As illustrated in FIG. 5, the memory cell array 10 includes a memory cell region A1, a dummy step region A2, and a dummy cell region A3. The regions will be explained below. Further, a bonding pad PD is provided on the memory cell array 10.

Figure 6:
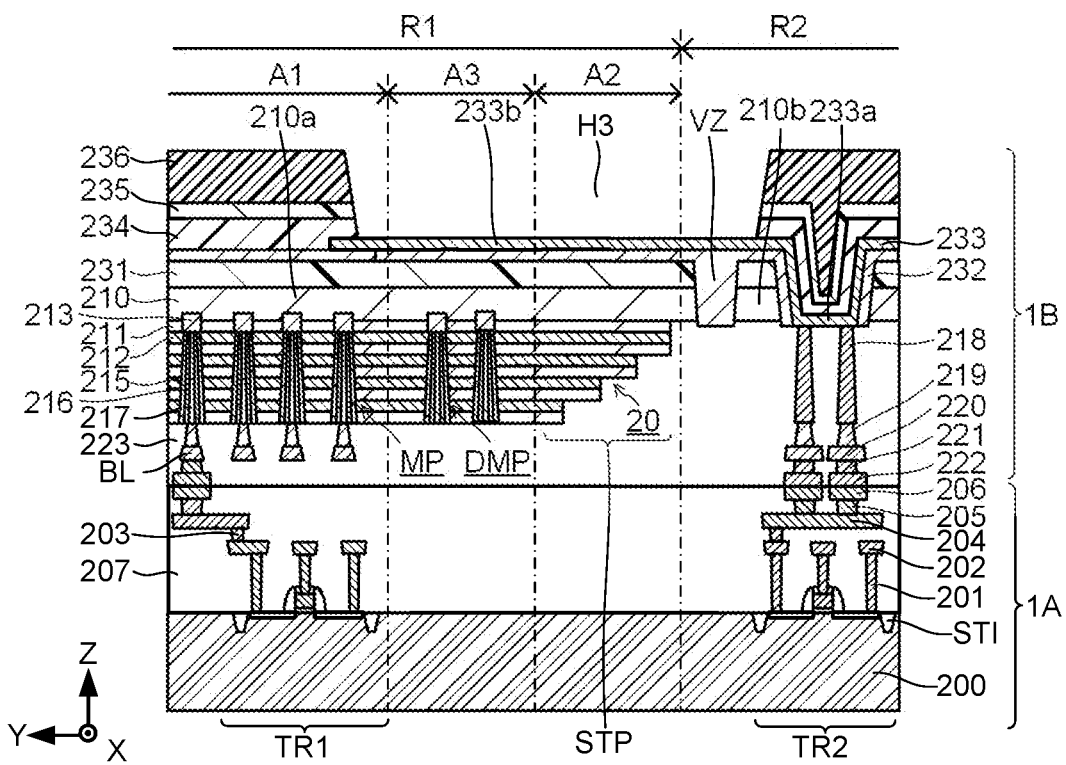
FIG. 6 is a cross-sectional schematic view for explaining a cross-sectional structure example of the first example of the memory 1.

FIG. 6 is a cross-sectional schematic view for explaining a cross-sectional structure example of the first example of the memory 1, and illustrates an X-axis direction along a surface of a substrate 200, a Y-axis direction along the surface and substantially perpendicular to the X-axis, and a Z-axis direction substantially perpendicularly intersecting with the surface.

The chip 1A illustrated in FIG. 6 has a field-effect transistor TR1 and a field-effect transistor TR2, a conductive layer 201, a conductive layer 202, a conductive layer 203, a conductive layer 205, a conductive layer 206, and an insulation layer 207 which are provided on the substrate 200.

The chip 1B illustrated in FIG. 6 has a substrate 210, an insulation layer 211, a conductive layer 212, a semiconductor layer 213, a memory layer 215, a semiconductor layer 216, a core insulation layer 217, a plug 218, a conductive layer 219, a conductive layer 220, a conductive layer 221, a conductive layer 222, an insulation layer 231, an insulation layer 232, a conductive layer 233, an insulation layer 234, an insulation layer 235, and an insulation layer 236. The conductive layer 212, the semiconductor layer 213, the memory layer 215, and the semiconductor layer 216 constitute the memory cell array 10. The region R1 and the region R2 are provided above the substrate 200.

The substrate 200 is, for example, a semiconductor substrate such as a silicon substrate.

The field-effect transistor TR1 is provided below the memory cell array 10. The field-effect transistor TR2 is provided below the plug 218. Each of the field-effect transistors TR1 and TR2 is an N-channel type transistor or a P-channel type transistor. The field-effect transistors TR1 and TR2 each constitute any of the peripheral circuits 110. Each of the field-effect transistors TR1 and TR2 is separated from one another by an element isolator STI.

The conductive layer 201 constitutes a contact plug. The conductive layer 202 constitutes a wiring layer. The wiring of the conductive layer 202 is connected to one of the gate, the source, and the drain of the field-effect transistor TR1 or the field-effect transistor TR2 via, for example, the contact plug of the conductive layer 201. The conductive layer 201 and the conductive layer 202 contain a metal material.

The conductive layer 203 constitutes a contact plug. The conductive layer 204 constitutes a wiring layer. The wiring of the conductive layer 204 is connected to one of wirings of the conductive layer 202 via, for example, the contact plug of the conductive layer 203. The conductive layer 203 and the conductive layer 204 contain a metal material.

The conductive layer 205 constitutes a contact plug. The conductive layer 206 constitutes a layer including a connection pad. The connection pad of the conductive layer 206 is connected to one of wirings of the conductive layer 204 via, for example, the contact plug of the conductive layer 205. The conductive layer 205 and the conductive layer 206 contain a metal material.

The insulation layer 207 provides insulation between the field-effect transistor TR1 and the field-effect transistor TR2 and between the wirings. The insulation layer 207 contains, for example, silicon oxide. The field-effect transistor TR1 and the field-effect transistor TR2 may be connected to the memory cell array 10 via a not-illustrated other wiring layer or contact plug.

The substrate 210 has a substrate part 210a provided above a stack 20 and memory pillars MP in the region R1, and a substrate part 210b provided above the region R2. The substrate part 210a and the substrate part 210b are electrically insulated from each other by the insulation separator VZ. The substrate part 210a is electrically connected to, for example, the semiconductor layer 213. The substrate part 210b is juxtaposed with the substrate part 210a in the Y-axis direction. The substrate 210 is a semiconductor substrate such as a silicon substrate.

Each insulation layer 211 and each conductive layer 212 are alternately stacked in the Z-direction to form the stack 20. The stack 20 extends along the Y-axis direction from the memory cell region A1 to the dummy step region A2. The plurality of conductive layers 212 constitute the select gate line SGS, the word line WL, and the select gate line SGD. The insulation layers 211 contain, for example, silicon oxide. The conductive layers 212 contain a metal material.

The semiconductor layer 213 is provided on the substrate 210. The semiconductor layer 213 is electrically connected to a not-illustrated source line SL via the substrate 210. The semiconductor layer 213 is, for example, a single-crystal silicon layer or a polycrystalline silicon layer. Not limited to this structure, an electrical connection with the conductive layer constituting the source line SL may be formed on a side surface of the semiconductor layer (semiconductor layer 216) forming the channel in the memory cell.

In the memory cell region A1, the memory layer 215, the semiconductor layer 216, and the core insulation layer 217 constitute the memory pillars MP. The memory pillars MP are provided through the stack 20 in the memory cell region A1. The memory cell region A1 is a region where memory cells are formed and one memory pillar MP corresponds to one NAND string NS.

The dummy step region A2 has a step portion STP provided at an end portion in the Y-axis direction of the stack 20 extending from the memory cell region A1. In the step portion STP, each insulation layer 211 and each conductive layer 212 are provided in tiers. The step portion STP is a dummy step portion electrically insulated from the peripheral circuit 110.

The dummy cell region A3 is provided between the memory cell region A1 and the dummy step region A2 in the Y-axis direction. In the dummy cell region A3, the memory layer 215, the semiconductor layer 216, and the core insulation layer 217 constitute dummy memory pillars DMP electrically insulated from the peripheral circuit 110. The dummy memory pillars DMP include memory cells not connected to the bit line BL or the word line WL. The dummy memory pillars DMP are provided through the stack 20 in the dummy cell region A3. The dummy memory pillars DMP are provided between the memory pillars MP and the step portion STP. The dummy memory pillar DMP has the same structure as that of the memory pillar MP.

The memory pillars MP and the dummy memory pillars DMP extend through the stack 20 in the Z-axis direction as illustrated in FIG. 6. The configurations of the memory pillars MP and the dummy memory pillars DMP extend along the Z-axis direction.

Figure 7:
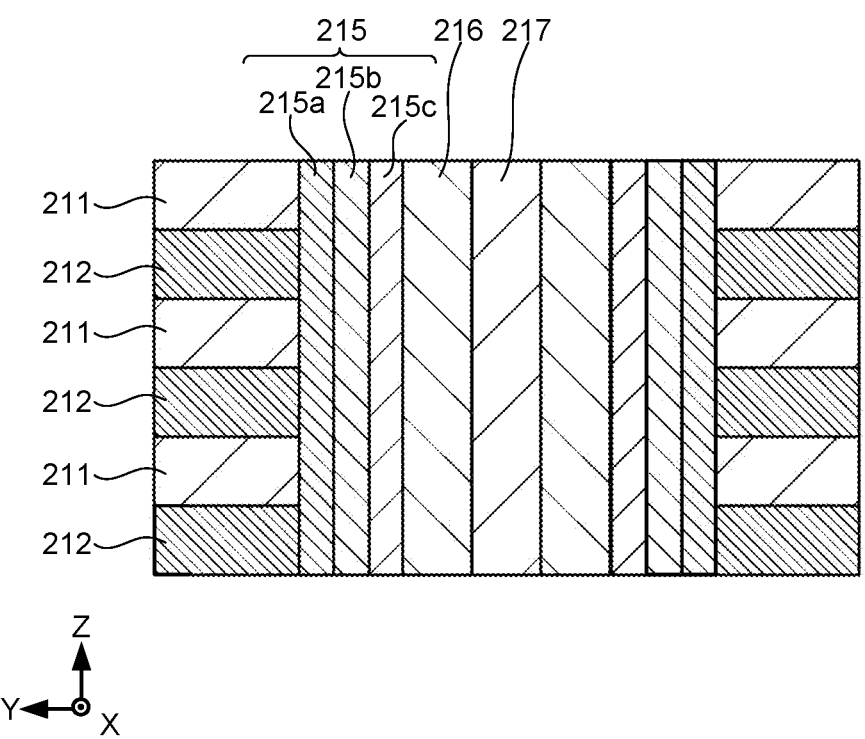
FIG. 7 is a cross-sectional schematic view illustrating a structure example of a memory pillar MP.

FIG. 7 is a cross-sectional schematic view for explaining a structure example of the memory pillar MP and illustrates a Y-Z cross-section. FIG. 7 illustrates the insulation layers 211, the conductive layers 212, the memory layer 215, the semiconductor layer 216, and the core insulation layer 217. The dummy memory pillar DMP has the same structure as that of the memory pillar MP and therefore the explanation of the structure example of the memory pillar MP can be appropriately applied to the explanation of the dummy memory pillar DMP.

The memory layer 215 has a block insulation film 215a, a charge storage film 215b, and a tunnel insulation film 215c.

The block insulation film 215a, the tunnel insulation film 215c, and the core insulation layer 217 contain, for example, silicon oxide. The charge storage film 215b contains, for example, silicon nitride. The semiconductor layer 216 contains, for example, polycrystalline silicon.

More specifically, a hole corresponding to the memory pillar MP is formed to penetrate through the stack 20 in the Z-axis direction. On the side surface of the hole, the block insulation film 215a, the charge storage film 215b, and the tunnel insulation film 215c are laminated in order. Further, the semiconductor layer 216 is formed in a manner that the side surface is in contact with the tunnel insulation film 215c.

The semiconductor layer 216 penetrates through the stack 20 along the Z-axis direction. The semiconductor layer 216 has channel regions of the select transistor ST1, the select transistor ST2, and the memory transistors MT. Therefore, the semiconductor layer 216 functions as a signal line connecting current paths of the select transistor ST1, the select transistor ST2, and the memory transistors MT.

The core insulation layer 217 is provided on the inner side of the semiconductor layer 216. The core insulation layer 217 extends along the semiconductor layer 216.

An intersection of the memory pillar MP and the conductive layer 212 constituting each word line WL functions as the memory transistor MT. An intersection of the memory pillar MP and the conductive layer 212 constituting each select gate line SGD functions as the select transistor ST1. An intersection of the memory pillar MP and the conductive layer 212 constituting each select gate line SGS functions as the select transistor ST2.

The plug 218 is provided in the region R2 above the substrate 200. The plug 218 extends in the Z-axis direction. The plug 218 electrically connects a connection part 233a of the conductive layer 233 and the peripheral circuit 110. FIG. 6 illustrates two plugs 218, but the number of plugs 218 is not limited to the number illustrated in FIG. 6.

The conductive layer 219 constitutes a contact plug. The conductive layer 220 constitutes a wiring layer. The wiring of the conductive layer 220 is connected to one of the plugs 218 via the contact plug of the conductive layer 219. The wiring layer of the conductive layer 220 further includes the bit line BL. The bit line BL is connected to one of the memory pillars MP via the contact plug of the conductive layer 219. The conductive layer 219 and the conductive layer 220 contain a metal material.

The conductive layer 221 constitutes a contact plug. The conductive layer 222 includes a connection pad. The connection pad of the conductive layer 222 is electrically connected to the conductive layer 220 via the contact plug of the conductive layer 221. The conductive layer 221 and the conductive layer 222 contain a metal material.

The connection pad of the conductive layer 222 is joined to the connection pad of the conductive layer 206. This enables electrically connect, for example, the memory pillars MP and the peripheral circuit 110 having the field-effect transistor TR1, and enables electrically connect the plug 218 and the peripheral circuit 110 having the field-effect transistor TR1.

An insulation layer 223 provides insulation between wirings of the memory cell array 10. The insulation layer 223 contains, for example, silicon oxide.

The insulation layer 231 is provided on the substrate 210. The insulation layer 231 contains, for example, silicon oxide.

The insulation layer 232 includes the insulation separator VZ. The insulation separator VZ is provided in the region R2. The insulation separator VZ penetrates through the substrate 210 in the Z-axis direction, extends in the X-axis direction, and electrically insulates the substrate part 210a and the substrate part 210b from each other. The insulation separator VZ illustrated in FIG. 6 does not overlap with the stack 20 in the Z-axis direction. The insulation layer 232 contains, for example, silicon oxide.

The conductive layer 233 constitutes the bonding pad PD illustrated in FIG. 5. The conductive layer 233 is provided above the substrate 210 with the insulation layer 232 therebetween. The wiring of the conductive layer 233 includes a connection part 233a and a pad part 233b.

The connection part 233a penetrates through the substrate 210 and the insulation layer 231 in the Z-axis direction and is provided on the plugs 218. Thus, the conductive layer 233 is electrically connected to the plugs 218, and electrically connected to the peripheral circuit 110 via the plugs 218, the conductive layer 219, the conductive layer 220, the conductive layer 222, the conductive layers 206, the conductive layer 205, the conductive layer 204, the conductive layer 203, the conductive layer 202, and the conductive layer 201. The connection part 233a and the plugs 218 illustrated in FIG. 6 do not overlap with the stack 20 in the Z-axis direction.

The pad part 233b includes a part defining the bonding pad PD to which a bonding wire is bonded. The pad part 233b extends in the Y-axis direction above the substrate part 210a in the dummy step region A2 and the dummy cell region A3 from the connection part 233a. The pad part 233b is exposed from the insulation layer 234, the insulation layer 235, and the insulation layer 236. In FIG. 6, the pad part 233b overlaps with the insulation separator VZ in the Z-axis direction.

The connection part 233a and the pad part 233b are formed of the same material. The connection part 233a and the pad part 233b contain, for example, a metal material such as aluminum.

The insulation layer 234, the insulation layer 235, and the insulation layer 236 are provided in order above the conductive layer 233. The insulation layer 234, the insulation layer 235, and the insulation layer 236 constitute a passivation film. The insulation layer 234 contains, for example, silicon oxide. The insulation layer 235 contains, for example, silicon nitride. The semiconductor layer 236 contains, for example, polyimide.

As explained above, the first example of the memory 1 has a structure in which the pad part of the bonding pad PD overlaps with the dummy step region A2 and the dummy cell region A3 of the memory cell array 10 in the Z-axis direction.

If the bonding pad PD is provided in the region R2, the area of the region R2 needs to be increased, resulting in increasing the chip area. In contrast, the pad part 233b including the region defining the bonding pad PD overlaps with the memory cell array 10 in the Z-axis direction to enable decreasing the chip area.

The first example of the memory 1 has the insulation separator VZ through the substrate 210 on which the memory cell array 10 is formed. The insulation separator VZ overlaps with the pad part 233b of the conductive layer 233 in the Z-axis direction. Even if the regions R1 including the memory cell arrays 10 are formed, the above structure enables electrically insulating the regions R1 from one another to prevent cracks of the substrate 210. Further, the formation of the plurality of bonding pads PD can omit the insulation separator for electrically insulating the bonding pads PD from one another to prevent the interference with the insulation separator VZ.

Next, a method of manufacturing the first example of the memory 1 will be explained. FIG. 8 to FIG. 18 are cross-sectional schematic views for explaining the method of manufacturing the first example of the memory 1, and illustrate the Y-Z cross-section.

Figure 8:
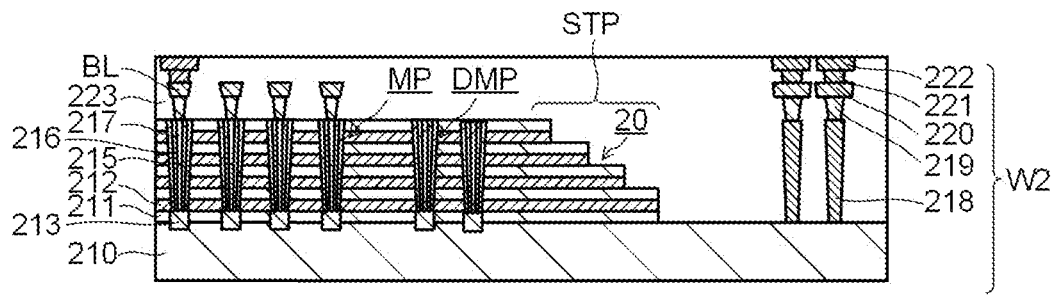
FIG. 8 is a cross-sectional schematic view for explaining a method of manufacturing the first example of the memory 1.
Figure 8:
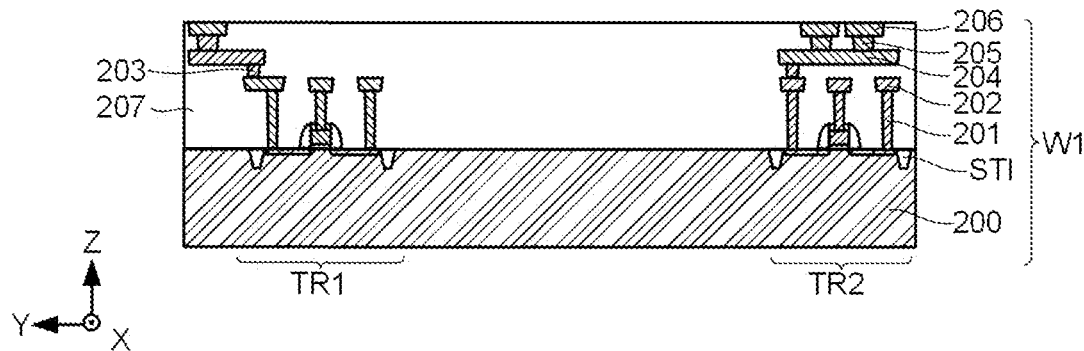

First, as illustrated in FIG. 8, a wafer W1 and a wafer W2 are independently prepared. The wafer W1 includes a plurality of chips 1A. The wafer W2 includes a plurality of chips 1B. The orientation of the wafer W2 illustrate in FIG. 8 is reverse to the orientation of the wafer W2 illustrated in FIG. 6.

The wafer W1 is manufactured by forming the field-effect transistor TR1 and the field-effect transistor TR2 on the substrate 200, and then forming the conductive layer 201, the conductive layer 202, the conductive layer 203, the conductive layer 205, the conductive layer 206, and the insulation layer 207 on the substrate 200.

The wafer W2 is manufactured by forming the semiconductor layer 213, the stack 20, the memory pillars MP, the dummy memory pillars DMP, the plugs 218, the conductive layer 219, the conductive layer 220, the conductive layer 221, the conductive layer 222, and the insulation layer 223 on the substrate 210.

Figure 9:
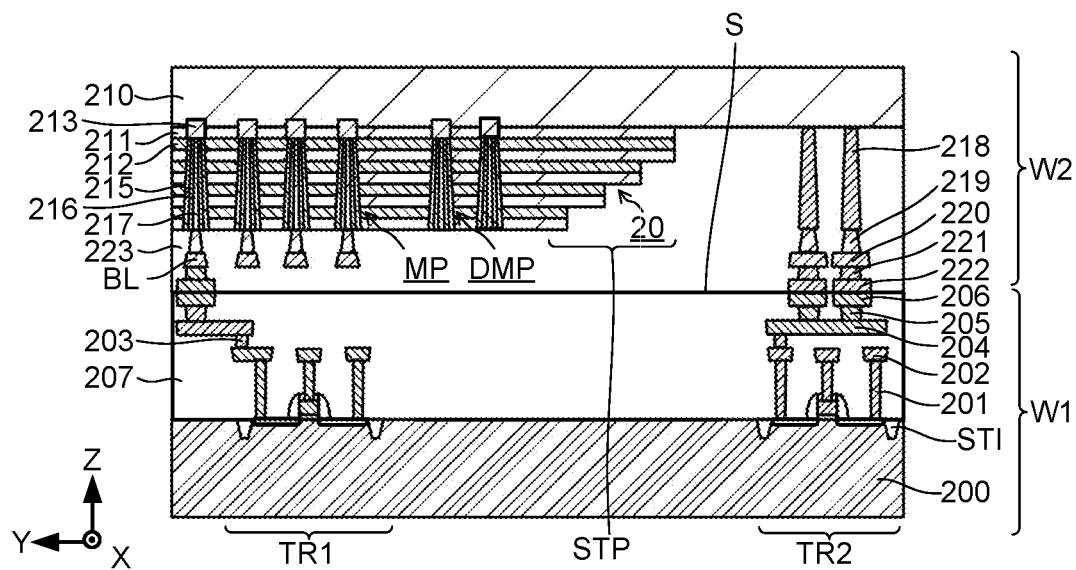
FIG. 9 is a cross-sectional schematic view for explaining the method of manufacturing the first example of the memory 1.

Next, as illustrated in FIG. 9, the orientation of the wafer W2 is reversed and the wafer W1 and the wafer W2 are stuck together. In this specification, the sticking together means bringing the wafer W1 and the wafer W2 into close contact with each other before a heat treatment.

Thereafter, the wafer W1 and the wafer W2 are bonded together. In this specification, the bonding means firmly fixing the wafer W1 and the wafer W2. The wafer W1 and the wafer W2 are bonded together, for example, the heat treatment. The conductive layer 206 and the conductive layer 222 are directly bonded by, for example, element diffusion between the metals, Van der Waals force, recrystallization due to volume expansion or melting or the like. Further, the wafer W1 and the wafer W2 can be bonded together by directly bonding them by element diffusion between the insulation layer 207 and the insulation layer 223, Van der Waals force, chemical reaction such as dehydration condensation or polymerization, or bonding between the metal and the insulation layer. These kinds of bonding are also called hybrid bonding. FIG. 9 illustrates an interface (stuck surface) S between the wafer W1 and the wafer W2, but the interface S cannot be clearly observed in some cases after the heat treatment.

Figure 10:
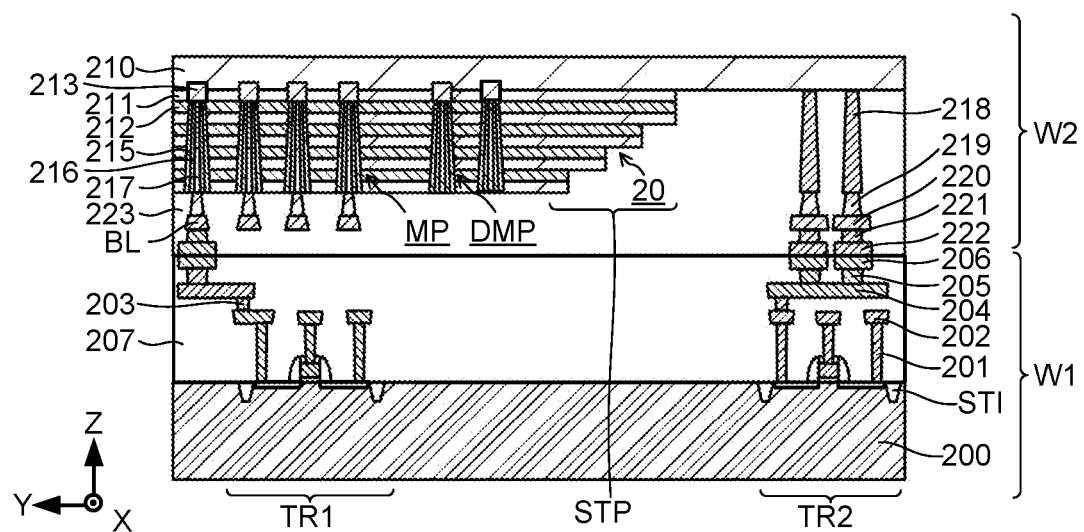
FIG. 10 is a cross-sectional schematic view for explaining the method of manufacturing the first example of the memory 1.

Next, as illustrated in FIG. 10, the substrate 210 is partially removed to be thinned. The substrate 210 can be partially removed, for example, by wet etching. The substrate 210 is preferably thinned with the well region of the substrate 210 remaining.

Figure 11:
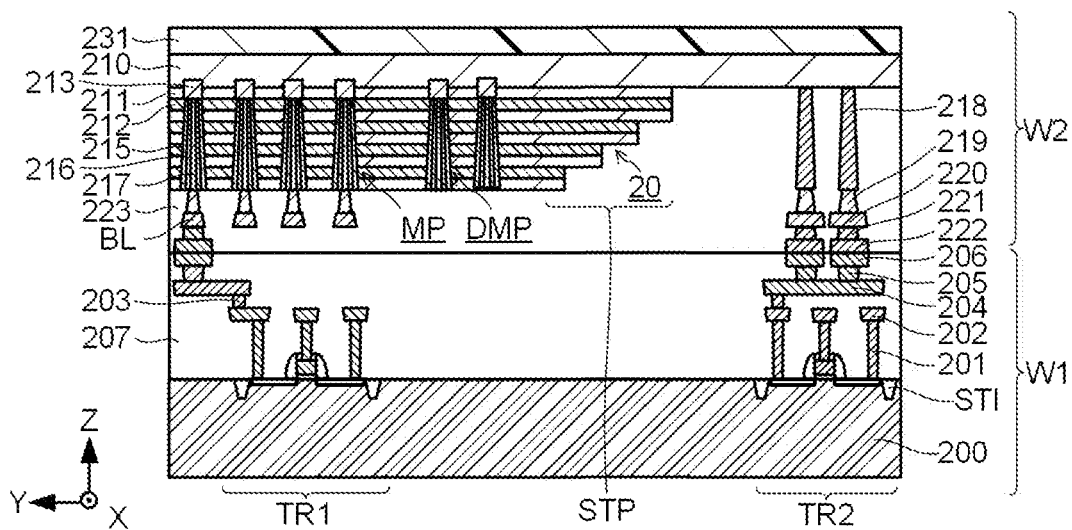
FIG. 11 is a cross-sectional schematic view for explaining the method of manufacturing the first example of the memory 1.

Next, as illustrated in FIG. 11, the insulation layer 231 is formed on the substrate 210.

Figure 12:
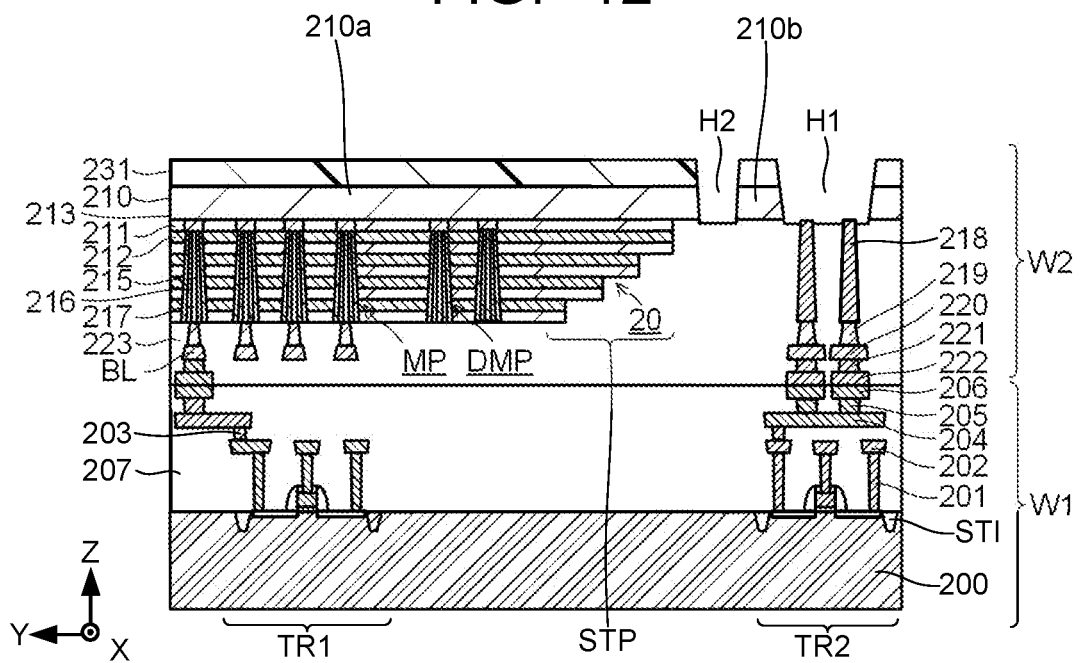
FIG. 12 is a cross-sectional schematic view for explaining the method of manufacturing the first example of the memory 1.

Next, as illustrated in FIG. 12, the substrate 210 and the insulation layer 231 are partially removed to form an opening H1 and an opening H2 to partially expose the insulation layer 223 and the plugs 218. The opening H1 is provided in a region where the connection part 233a illustrated in FIG. 6 is to be formed. The opening H2 is provided in a region where the insulation separator VZ illustrated in FIG. 6 is to be formed. The opening H2 divides the substrate 210 into a plurality of regions including the substrate part 210a and the substrate part 210b. The substrate 210 and the insulation layer 231 are partially removable using, for example, the reactive ion etching (RIE).

Figure 13:
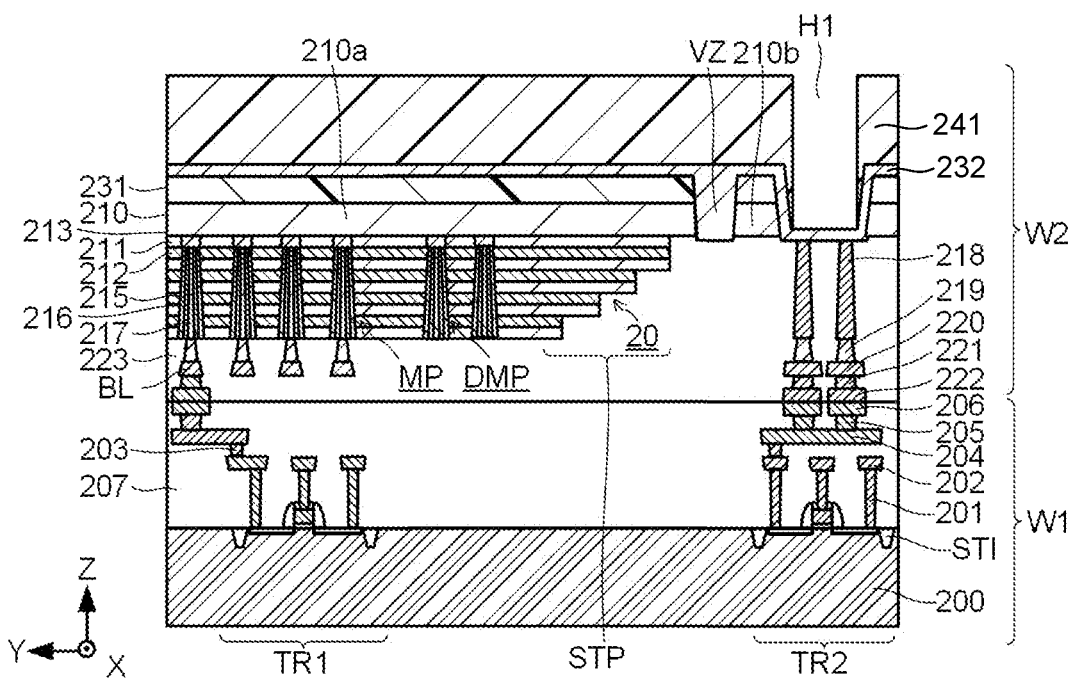
FIG. 13 is a cross-sectional schematic view for explaining the method of manufacturing the first example of the memory 1.

Next, as illustrated in FIG. 13, the insulation layer 232 including the insulation separator VZ in the opening H2 is formed. The insulation layer 232 is formed, for example, on the surface of the insulation layer 231 and in the openings H1, H2. Further, as illustrated in FIG. 13, a resist layer 241 having the opening H1 is formed on the insulation layer 232. The opening H1 exposes a part of the insulation layer 232.

Figure 14:
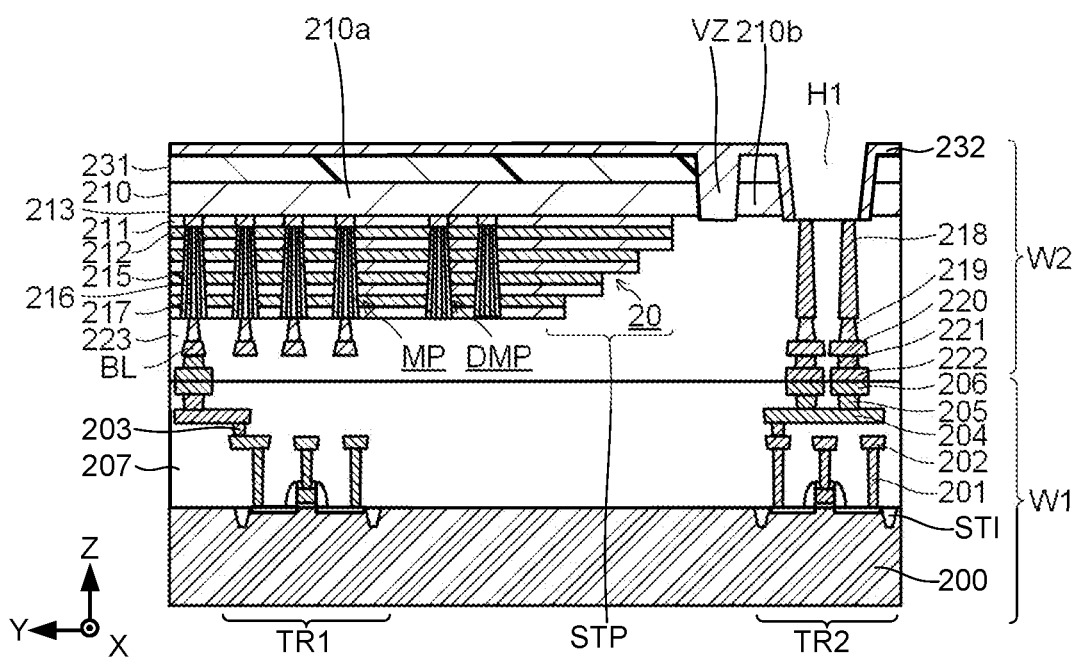
FIG. 14 is a cross-sectional schematic view for explaining the method of manufacturing the first example of the memory 1.

Next, as illustrated in FIG. 14, an exposed portion of the insulation layer 232 is removed to expose the plugs 218. The exposed portion of the insulation layer 232 is removable using, for example, RIE.

Figure 15:
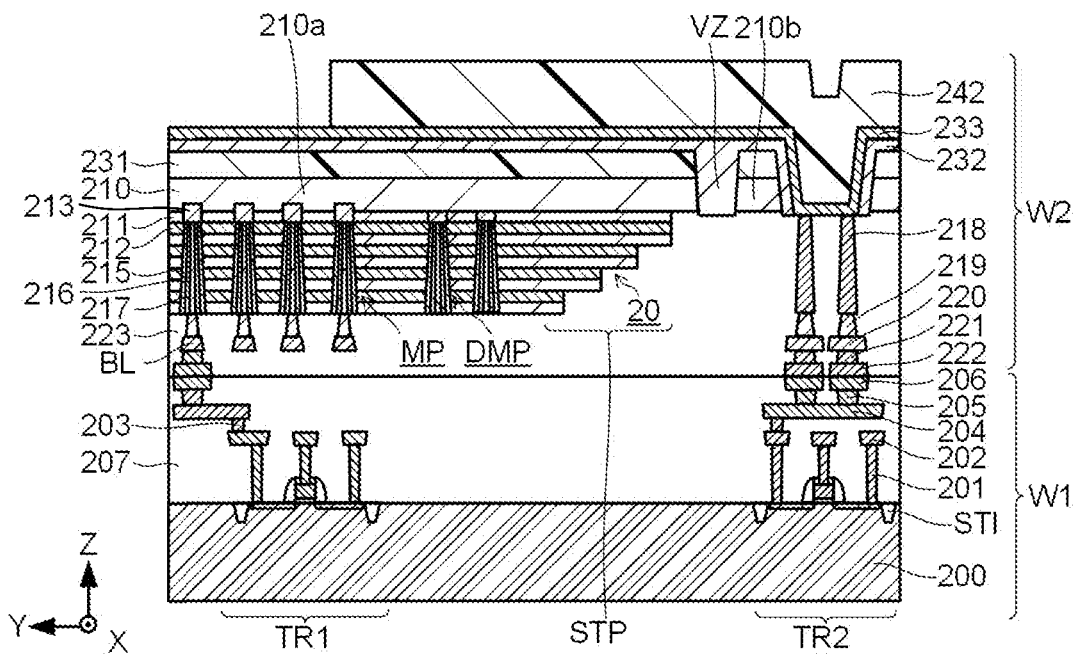
FIG. 15 is a cross-sectional schematic view for explaining the method of manufacturing the first example of the memory 1.

Next, as illustrated in FIG. 15, the conductive layer 233 is formed on the insulation layer 232, a resist layer 242 is formed on the conductive layer 233, and the resist layer 242 is partially removed to partially expose the conductive layer 233 while covering the regions where the connection part 233a and the pad part 233b are to be formed.

Figure 16:
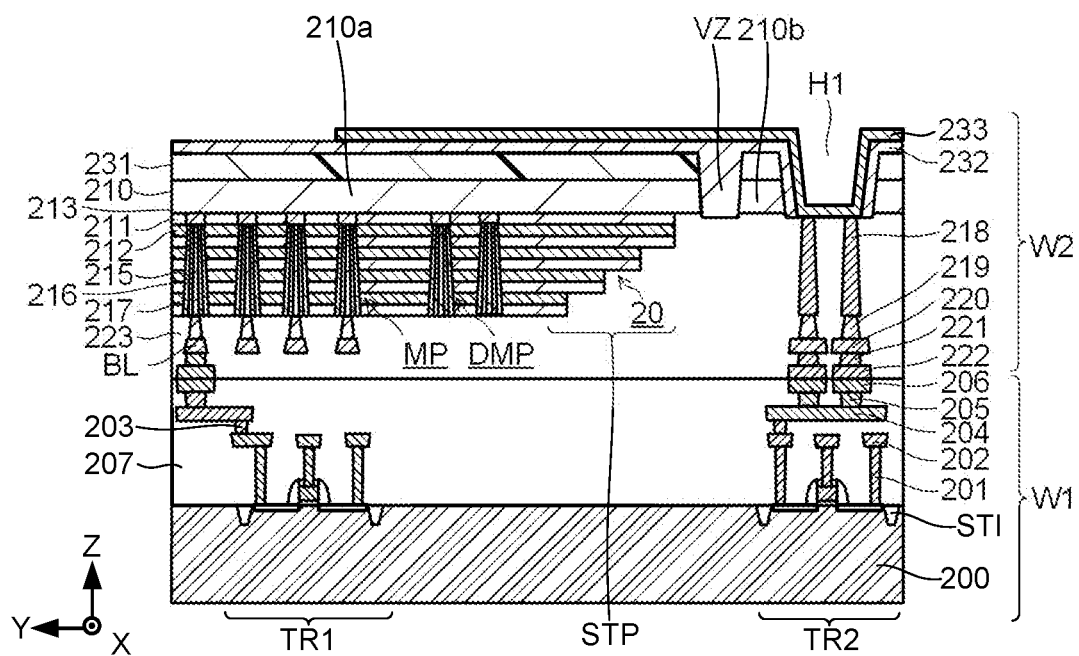
FIG. 16 is a cross-sectional schematic view for explaining the method of manufacturing the first example of the memory 1.

Next, as illustrated in FIG. 16, the exposed portion of the conductive layer 233 is partially removed using the resist layer 242 as a mask. The conductive layer 233 can be partially removed by, for example, RIE.

Figure 17:
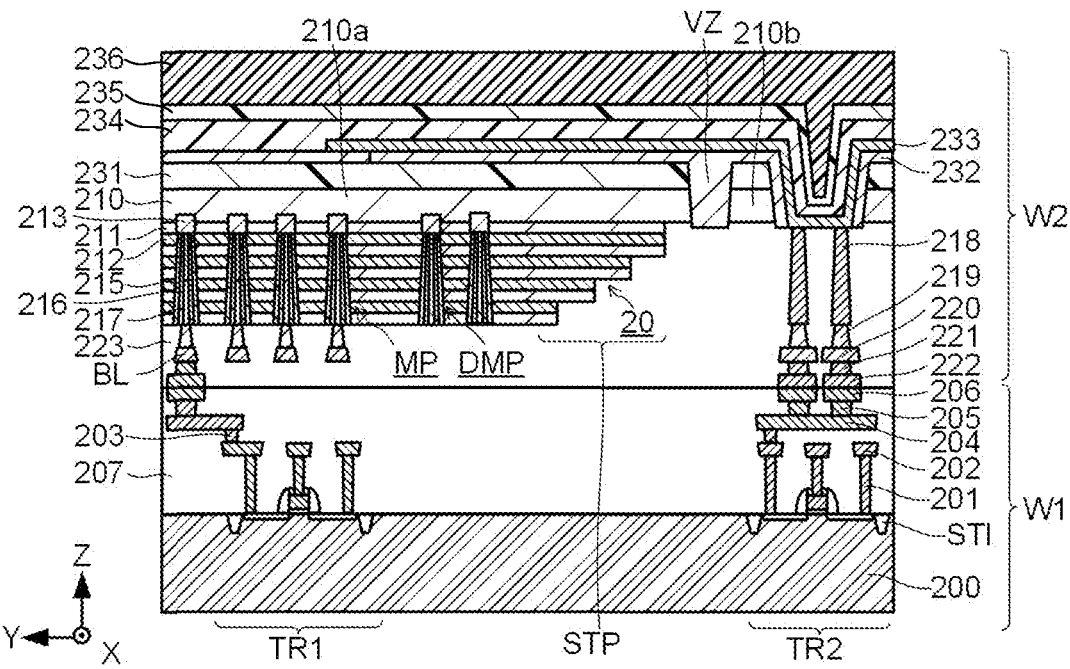
FIG. 17 is a cross-sectional schematic view for explaining the method of manufacturing the first example of the memory 1.

Next, as illustrated in FIG. 17, the insulation layer 234, the insulation layer 235, and the insulation layer 236 are formed in order on the conductive layer 233.

Figure 18:
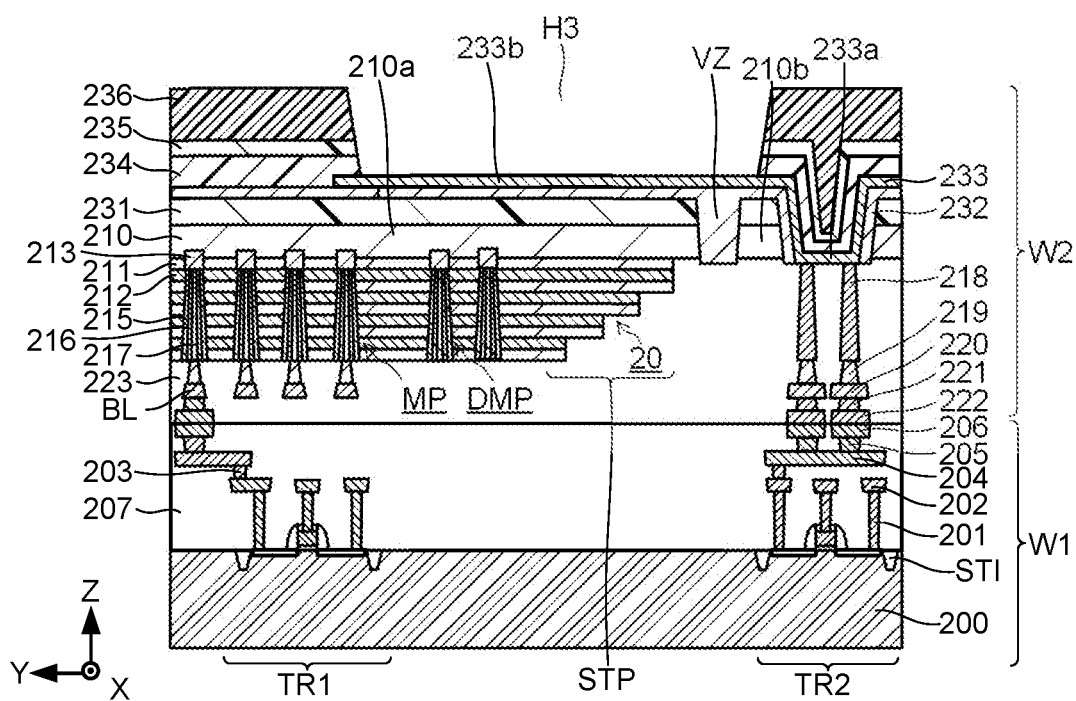
FIG. 18 is a cross-sectional schematic view for explaining the method of manufacturing the first example of the memory 1.

Next, as illustrated in FIG. 18, the insulation layer 234, the insulation layer 235, and the insulation layer 236 are partially removed to form an opening H3 which exposes the region where the pad part 233b of the conductive layer 233 is to be formed. The insulation layer 234, the insulation layer 235, and the insulation layer 236 are partially removable using, for example, RIE.

Thereafter, the wafer W1 and the wafer W2 are cut into a plurality of chips by dicing. These chips are made by cutting so that each of them includes one chip 1A and one chip 1B. The above steps can manufactures the memory 1. The above is the explanation of the method of manufacturing the first example of the memory 1.

Second Example of Memory 1

Figure 19:
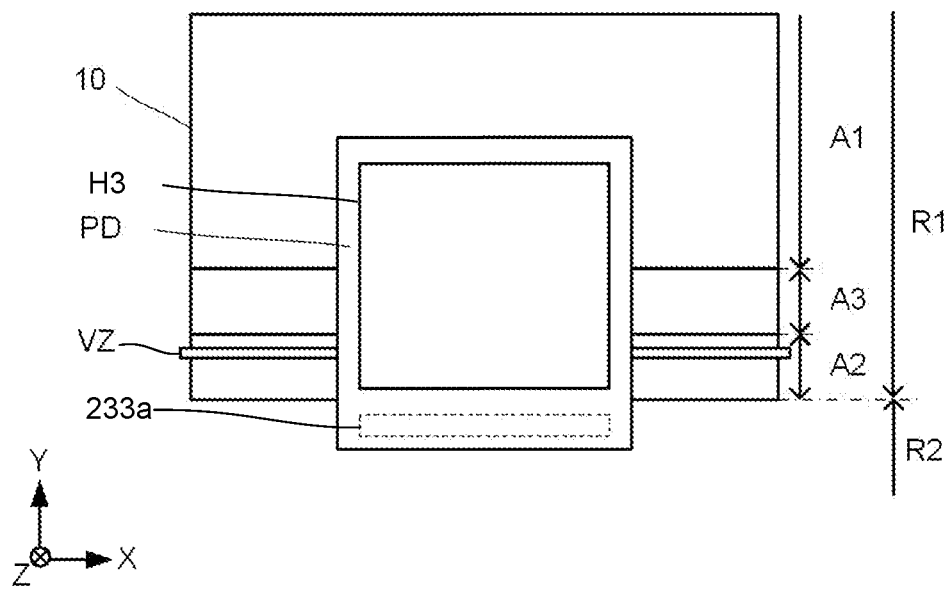
FIG. 19 is a planar schematic view illustrating a part of the chip 1B in a second example of the memory 1.
Figure 20:
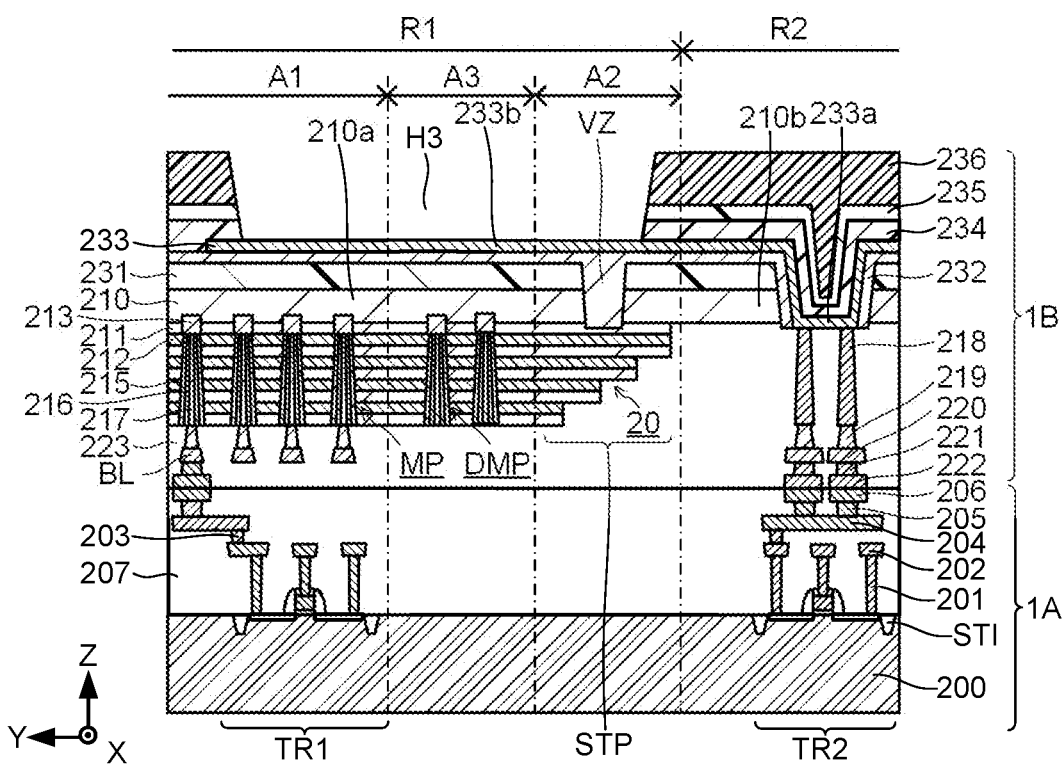
FIG. 20 is a cross-sectional schematic view for explaining a cross-sectional structure example of the second example of the memory 1.

A second example of the memory 1 will be explained referring to FIG. 19 and FIG. 20. FIG. 19 is a planar schematic view illustrating a part of the chip 1B in the second example of the memory 1 and illustrates an X-Y plane. FIG. 20 is a cross-sectional schematic view for explaining a cross-sectional structure example of the second example of the memory 1, and illustrates an X-axis direction along the surface of the substrate 200, a Y-axis direction along the surface and substantially perpendicular to the X-axis, and a Z-axis direction substantially perpendicularly intersecting with the surface. The explanation of the same as those in the first example is omitted in this example, and portions different from those in the first example will be explained below.

As compared with the first example of the memory 1, the second example of the memory 1 is different in that the pad part 233b overlaps with the dummy cell region A3 and the insulation separator VZ overlaps with the dummy step region A2 in the Z-axis direction. The rest of the memory 1 has the same structures as those in the memory 1 illustrated in FIG. 6, and therefore the explanation thereof is omitted in this example and the differences therefrom will be explained below.

The insulation separator VZ overlaps with the step portion STP in the Z-axis direction. In the method of manufacturing the memory 1 in the first example, the insulation separator VZ can be provided by forming the opening H2 which partially exposes the insulation layer 211 illustrated in FIG. 12 so as to overlap with the step portion STP, and then forming the insulation layer 232 in the opening H2.

The pad part 233b extends from the connection part 233a to the upper side of the dummy cell region A3. The pad part 233b is exposed from the insulation layer 234, the insulation layer 235, and the insulation layer 236.

The second example of the memory 1 has a structure in which the pad part of the bonding pad PD overlaps with the memory cell region A1, the dummy step region A2, and the dummy cell region A3 of the memory cell array 10 in the Z-axis direction. This can reduce the chip area. Further, in the second example of the memory 1, the insulation separator VZ is formed to overlap with the dummy step region A2. Even if the regions R1 including the memory cell arrays 10 are formed, the above structure including the insulation separator VZ enables electrically insulating the regions R1 from one another to prevent cracks of the substrate 210. Further, the formation of the plurality of bonding pads PD can omit the insulation separator for electrically insulating the plurality of bonding pads PD from one another to prevent the interference with the insulation separator VZ.

The second example of the memory 1 can be appropriately combined with other examples of the memory 1.

Third Example of Memory 1

Figure 21:
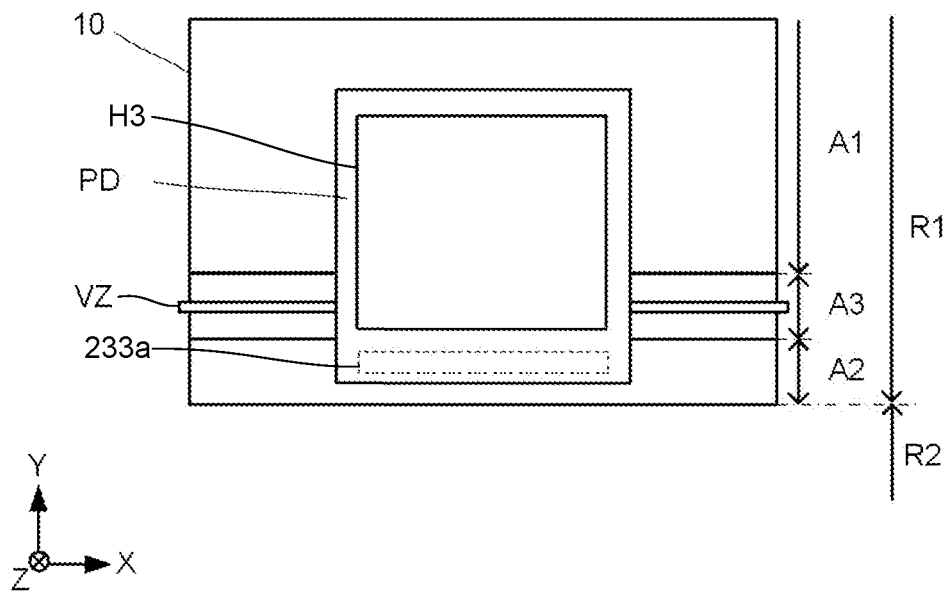
FIG. 21 is a planar schematic view illustrating a part of the chip 1B in a third example of the memory 1.
Figure 22:
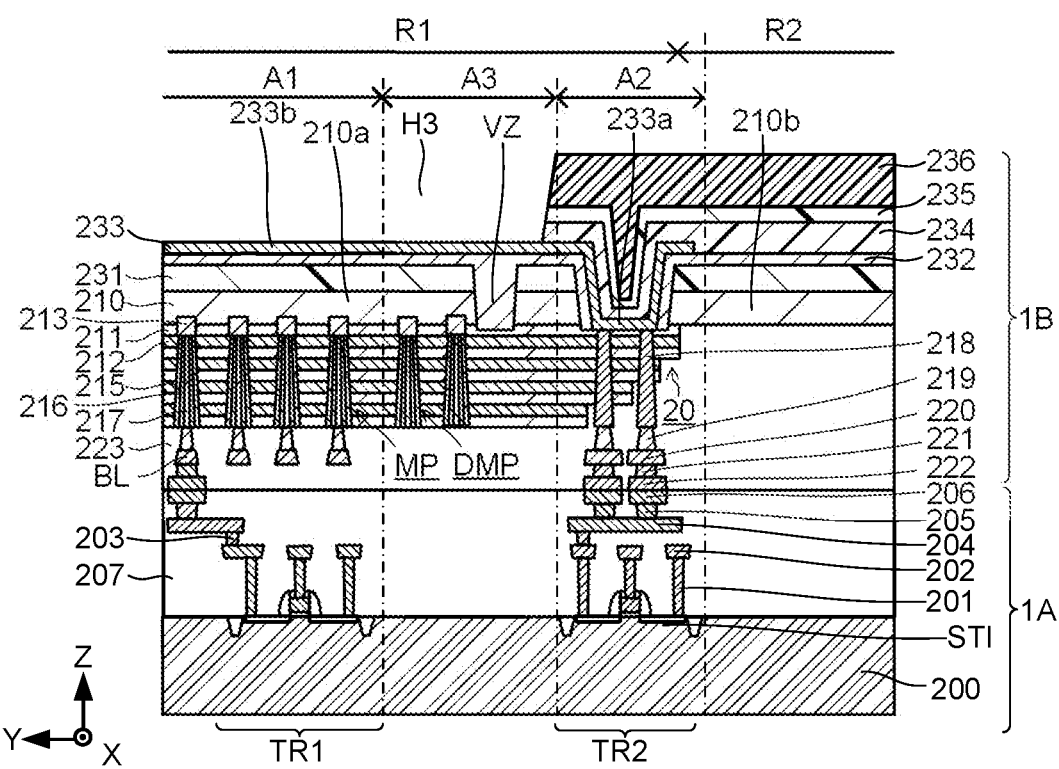
FIG. 22 is a cross-sectional schematic view for explaining a cross-sectional structure example of the third example of the memory 1.

A third example of the memory 1 will be explained referring to FIG. 21 and FIG. 22. FIG. 21 is a planar schematic view illustrating a part of the chip 1B in the third example of the memory 1 and illustrates an X-Y plane. FIG. 22 is a cross-sectional schematic view for explaining a cross-sectional structure example of the third example of the memory 1, and illustrates an X-axis direction along the surface of the substrate 200, a Y-axis direction along the surface and substantially perpendicular to the X-axis, and a Z-axis direction substantially perpendicularly intersecting with the surface. The explanation of the same as those in the first example is omitted in this example, and portions different from those in the first example will be explained below.

As compared with the first example of the memory 1, the third example of the memory 1 is different in that the connection part 233a overlaps with the step portion STP in the dummy step region A2, the pad part 233b overlaps with the memory cell region A1, the insulation separator VZ overlaps with the dummy cell region A3, and the plugs 218 are provided in the dummy step region A2 in the Z-axis direction. The rest of the memory 1 has the same structures as those in the memory 1 illustrated in FIG. 6, and therefore the explanation thereof is omitted in this example and the differences therefrom will be explained below.

The insulation separator VZ does not overlap with the dummy memory pillars DMP in the Z-axis direction. For example, in the method of manufacturing the memory 1 in the first example, the insulation separator VZ is provided by forming the opening H2 illustrated in FIG. 12 in the dummy cell region A3, and then forming the insulation layer 232 in the opening H2.

The plugs 218 penetrate through the stack 20 in the Z-axis direction in the dummy step region A2 including the step portion STP. The plugs 218 can be electrically insulated from the stack 20 by forming an insulator on the side surface of each plug 218. In the dummy step region A2, the plugs 218 are electrically connected to the peripheral circuit 110 via the conductive layer 219, the conductive layer 220, the conductive layer 222, the conductive layer 206, the conductive layer 205, the conductive layer 204, the conductive layer 203, the conductive layer 202, and the conductive layer 201.

The connection part 233a is provided on the plugs 218 in the dummy step region A2. The connection part 233a overlaps with the step portion STP in the Z-axis direction. Thus, the conductive layer 233 is electrically connected to the plugs 218, and electrically connected to the peripheral circuit 110 via the plugs 218, the conductive layer 219, the conductive layer 220, conductive layer 222, the conductive layer 206, the conductive layer 205, the conductive layer 204, the conductive layer 203, the conductive layer 202, and the conductive layer 201.

The pad part 233b extends from the connection part 233a to the upper side of the memory cell region A1. The pad part 233b is exposed from the insulation layer 234, the insulation layer 235, and the insulation layer 236.

The third example of the memory 1 has a structure in which the pad part of the bonding pad PD overlaps with the memory cell region A1 and the dummy cell region A3 of the memory cell array 10 in the Z-axis direction. This can reduce the chip area. Further, in the third example of the memory 1, the insulation separator VZ is formed to overlap with the dummy step region A2. Even if the plurality of regions R1 including the memory cell arrays 10 are formed, the above structure including the insulation separator VZ enables electrically insulating the regions R1 from one another to prevent cracks of the substrate 210. Further, the formation of the plurality of bonding pads PD can omit the insulation separator for electrically insulating the bonding pads PD from one another to prevent the interference with the insulation separator VZ.

The third example of the memory 1 can be appropriately combined with other examples of the memory 1.

Fourth Example of Memory 1

Figure 23:
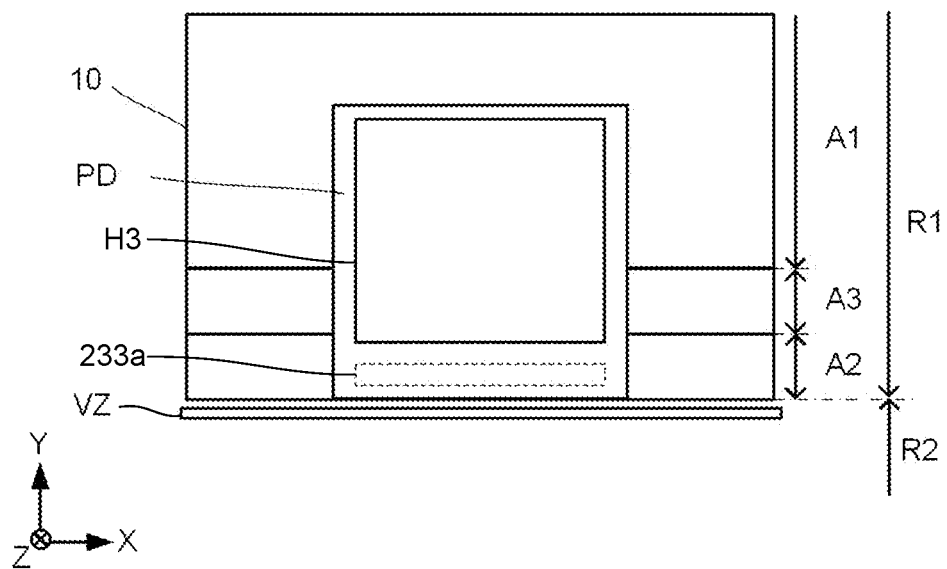
FIG. 23 is a planar schematic view illustrating a part of the chip 1B in a fourth example of the memory 1.
Figure 24:
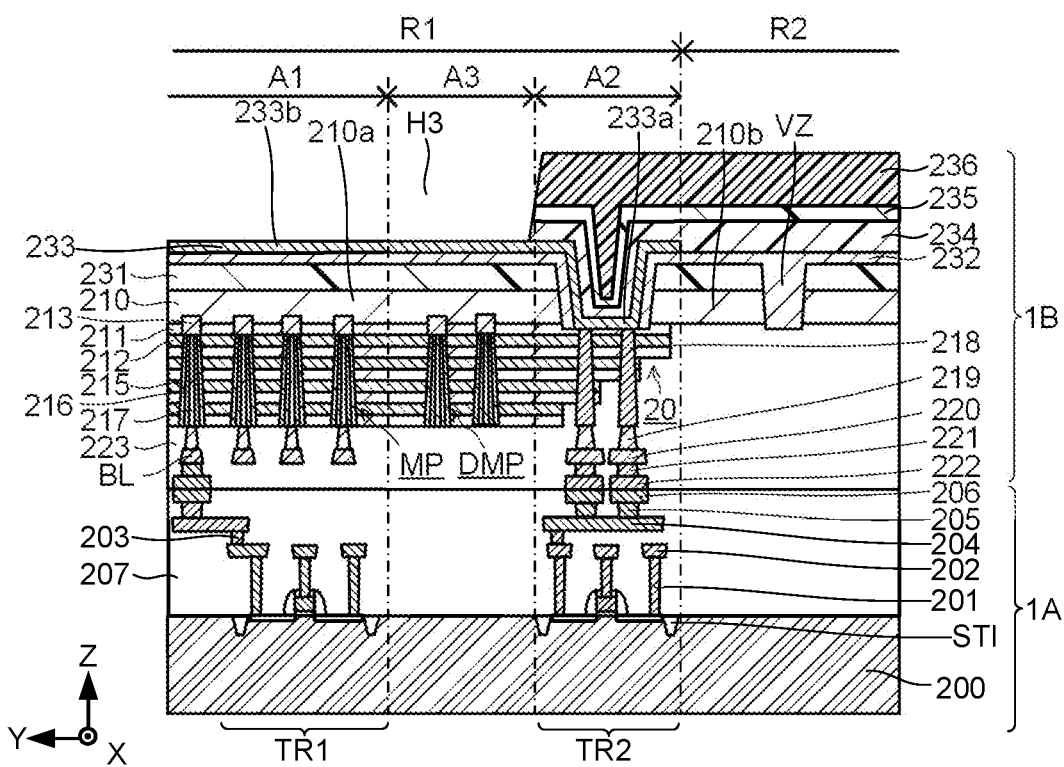
FIG. 24 is a cross-sectional schematic view for explaining a cross-sectional structure example of the fourth example of the memory 1.

A fourth example of the memory 1 will be explained referring to FIG. 23 and FIG. 24. FIG. 23 is a planar schematic view illustrating a part of the chip 1B in the fourth example of the memory 1 and illustrates an X-Y plane. FIG. 24 is a cross-sectional schematic view for explaining a cross-sectional structure example of the fourth example of the memory 1, and illustrates an X-axis direction along the surface of the substrate 200, a Y-axis direction along the surface and substantially perpendicular to the X-axis, and a Z-axis direction substantially perpendicularly intersecting with the surface. The explanation of the same as those in the first example is omitted in this example, and the differences from those in the first example will be explained below.

As compared with the first example of the memory 1, the fourth example of the memory 1 is different in that the connection part 233a overlaps with the dummy step region A2, the pad part 233b overlaps with the memory cell region A1, the insulation separator VZ does not overlap with the dummy step region A2, and the plugs 218 are provided in the dummy step region A2 in the Z-axis direction. The rest of the memory 1 has the same structures as those in the memory 1 illustrated in FIG. 6, and therefore the explanation thereof is omitted in this example and the differences therefrom will be explained below.

The plugs 218 penetrate through the stack 20 in the Z-axis direction in the dummy step region A2 including the step portion STP. The plugs 218 can be electrically insulated from the stack 20 by forming an insulator on the side surface of each plug 218. In the dummy step region A2, the plugs 218 are electrically connected to the peripheral circuit 110 via the conductive layer 219, the conductive layer 220, the conductive layer 222, the conductive layers 206, the conductive layer 205, the conductive layer 204, the conductive layer 203, the conductive layer 202, and the conductive layer 201.

The connection part 233a is provided between the substrate part 210a of the substrate 210 and the insulation separator VZ. The connection part 233a overlaps with the step portion STP in the Z-axis direction. The connection part 233a is provided on the plugs 218 in the dummy step region A2. Thus, the conductive layer 233 is electrically connected to the plugs 218, and electrically connected to the peripheral circuit 110 via the plugs 218, the conductive layer 219, the conductive layer 220, conductive layer 222, the conductive layer 206, the conductive layer 205, the conductive layer 204, the conductive layer 203, the conductive layer 202, and the conductive layer 201.

The pad part 233b extends from the connection part 233a to the upper side of the memory cell region A1. The pad part 233b is exposed from the insulation layer 234, the insulation layer 235, and the insulation layer 236.

The insulation separator VZ does not overlap with the step portion STP in the Z-axis direction. For example, in the method of manufacturing the memory 1 in the first example, the insulation separator VZ is provided by forming the opening H2 illustrated in FIG. 12 so as not to overlap with the step portion STP, and then forming the insulation layer 232 in the opening H2.

The fourth example of the memory 1 has a structure in which the pad part of the bonding pad PD overlaps with the memory cell region A1 and the dummy cell region A3 of the memory cell array 10 in the Z-axis direction. This can reduce the chip area. Further, in the fourth example of the memory 1, the connection part 233a is formed to overlap with the dummy step region A2 and the insulation separator VZ is formed not to overlap with the dummy step region A2. Even if the plurality of regions R1 including the memory cell arrays 10 are formed, the above structure including the insulation separator VZ enables electrically insulating the regions R1 from one another to prevent cracks of the substrate 210. Further, the formation of the plurality of bonding pads PD can omit the insulation separator for electrically insulating the plurality of bonding pads PD from one another to prevent the interference with the insulation separator VZ.

The fourth example of the memory 1 can be appropriately combined with other examples of the memory 1.

Fifth Example of Memory 1

Figure 25:
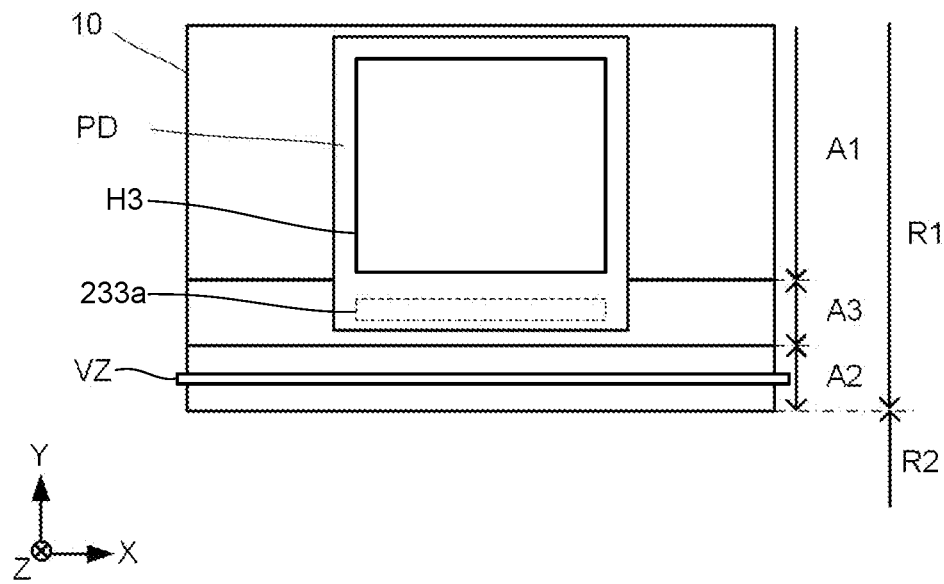
FIG. 25 is a planar schematic view illustrating a part of the chip 1B in a fifth example of the memory 1.
Figure 26:
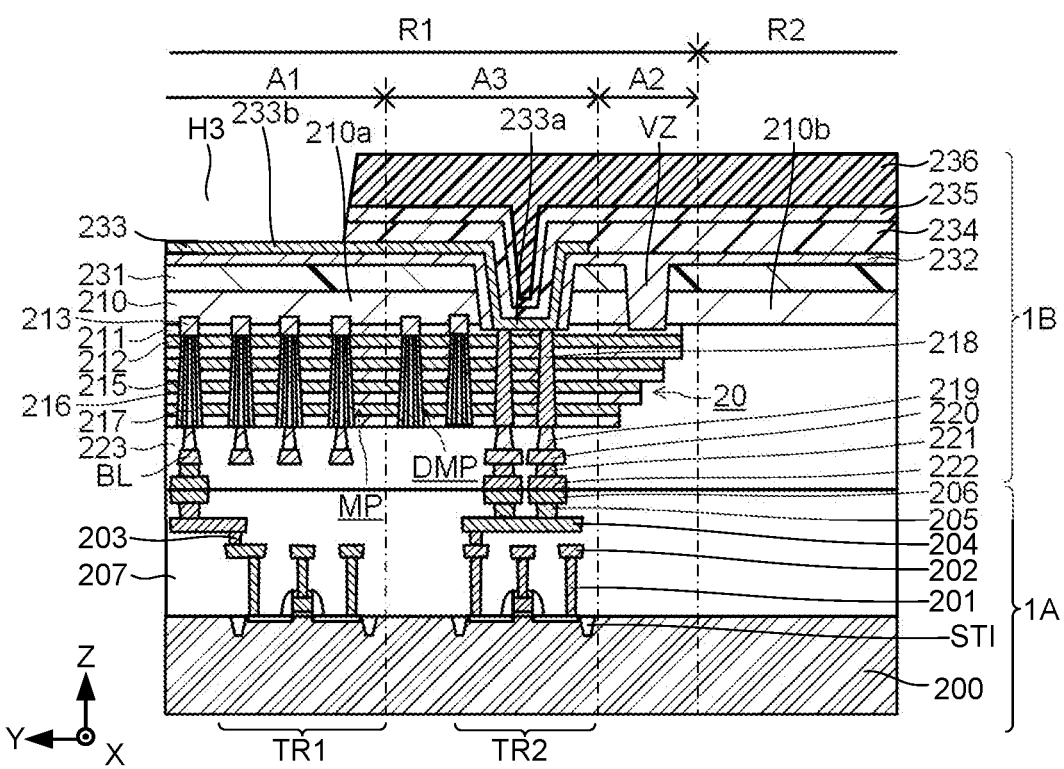
FIG. 26 is a cross-sectional schematic view for explaining a cross-sectional structure example of the fifth example of the memory 1.

A fifth example of the memory 1 will be explained referring to FIG. 25 and FIG. 26. FIG. 25 is a planar schematic view illustrating a part of the chip 1B in the fifth example of the memory 1 and illustrates an X-Y plane. FIG. 26 is a cross-sectional schematic view for explaining a cross-sectional structure example of the fifth example of the memory 1, and illustrates an X-axis direction along the surface of the substrate 200, a Y-axis direction along the surface and substantially perpendicular to the X-axis, and a Z-axis direction substantially perpendicularly intersecting with the surface. The explanation of the same as those in the first example is omitted in this example, and portions different from those in the first example will be explained below.

As compared with the first example of the memory 1, the fifth example of the memory 1 is different in that the connection part 233a overlaps with the dummy cell region A3, the pad part 233b overlaps with the memory cell region A1, and the insulation separator VZ overlaps with the dummy step region A2 in the Z-axis direction. The rest of the memory 1 has the same structures as those in the memory 1 illustrated in FIG. 6, and therefore the explanation thereof is omitted in this example and the differences therefrom will be explained below.

The plugs 218 are provided between the memory pillars MP and the step portion STP. The plugs 218 penetrate through the stack 20 in the Z-axis direction in the dummy cell region A3. The plugs 218 can be electrically insulated from the stack 20 by forming an insulator on the side surface of each plug 218. In the dummy cell region A3, the plugs 218 are electrically connected to the peripheral circuit 110 via the conductive layer 219, the conductive layer 220, the conductive layer 222, the conductive layer 206, the conductive layer 205, the conductive layer 204, the conductive layer 203, the conductive layer 202, and the conductive layer 201.

The connection part 233a is provided between the substrate part 210a and the insulation separator VZ. The connection part 233a is provided on the plugs 218 in the dummy cell region A3. Thus, the conductive layer 233 is electrically connected to the plugs 218, and electrically connected to the peripheral circuit 110 via the plugs 218, the conductive layer 219, the conductive layer 220, conductive layer 222, the conductive layer 206, the conductive layer 205, the conductive layer 204, the conductive layer 203, the conductive layer 202, and the conductive layer 201.

The pad part 233b extends from the connection part 233a to the upper side of the memory cell region A1. The pad part 233b is exposed from the insulation layer 234, the insulation layer 235, and the insulation layer 236.

The insulation separator VZ overlaps with the step portion STP in the Z-axis direction. For example, in the method of manufacturing the memory 1 in the first example, the insulation separator VZ is provided by forming the opening H2 illustrated in FIG. 12 so as to overlap with the step portion STP, and then forming the insulation layer 232 in the opening H2.

The fifth example of the memory 1 has a structure in which the pad part of the bonding pad PD overlaps with the memory cell region A1 of the memory cell array 10 in the Z-axis direction. This can reduce the chip area. Further, in the fifth example of the memory 1, the connection part 233a is formed to overlap with the dummy cell region A3 and the insulation separator VZ is formed to overlap with the dummy step region A2. Even if the plurality of regions R1 including the memory cell arrays 10 are formed, the above structure including the insulation separator VZ enables electrically insulating the regions R1 from one another to prevent cracks of the substrate 210. Further, the formation of the plurality of bonding pads PD can omit the insulation separator for electrically insulating the plurality of bonding pads PD from one another to prevent the interference with the insulation separator VZ.

The fifth example of the memory 1 can be appropriately combined with other examples of the memory 1.

Sixth Example of Memory 1

Figure 27:
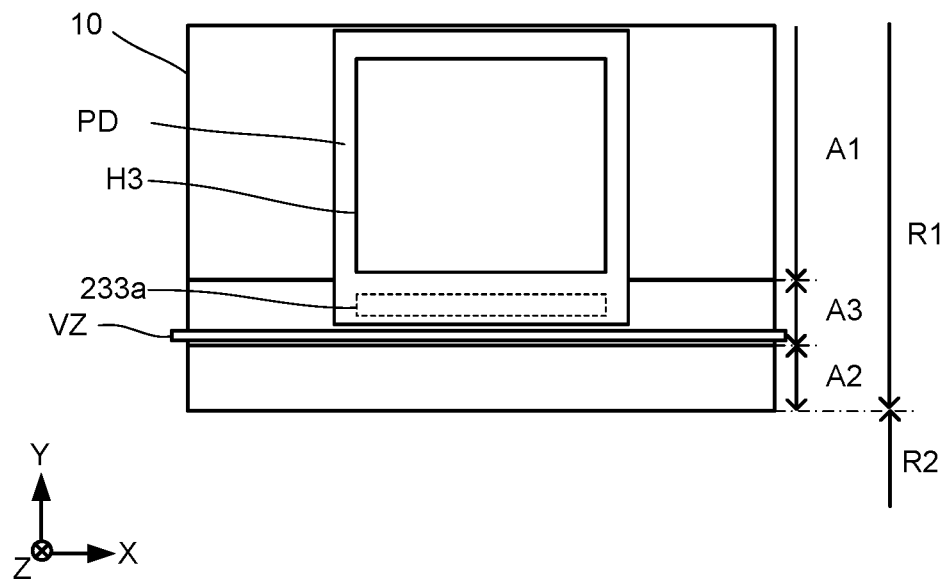
FIG. 27 is a planar schematic view illustrating a part of the chip 1B in a sixth example of the memory 1.
Figure 28:
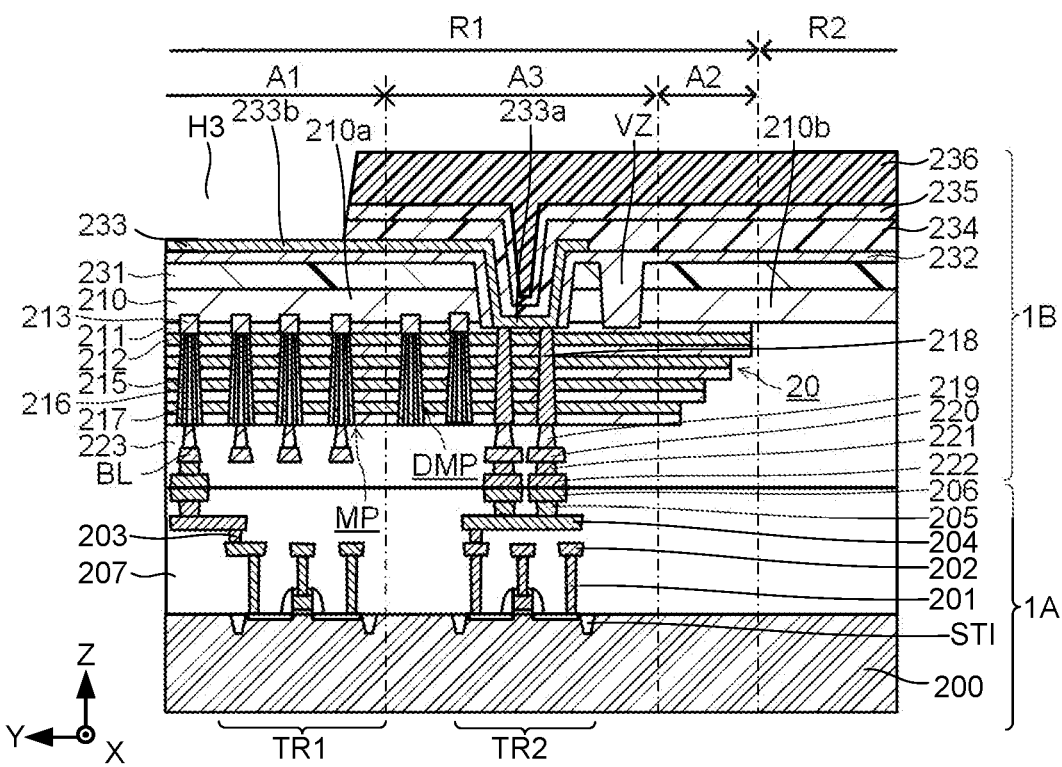
FIG. 28 is a cross-sectional schematic view for explaining a cross-sectional structure example of the sixth example of the memory 1.

A sixth example of the memory 1 will be explained referring to FIG. 27 and FIG. 28. FIG. 27 is a planar schematic view illustrating a part of the chip 1B in the sixth example of the memory 1 and illustrates an X-Y plane. FIG. 28 is a cross-sectional schematic view for explaining a cross-sectional structure example of the sixth example of the memory 1, and illustrates an X-axis direction along the surface of the substrate 200, a Y-axis direction along the surface and substantially perpendicular to the X-axis, and a Z-axis direction substantially perpendicularly intersecting with the surface. The explanation of the same as those in the first example is omitted in this example, and the differences from those in the first example will be explained below.

As compared with the first example of the memory 1, the sixth example of the memory 1 is different in that the connection part 233a overlaps with the dummy cell region A3, the pad part 233b overlaps with the memory cell region A1, and the insulation separator VZ overlaps with the dummy cell region A3. The rest of the memory 1 has the same structures as those in the memory 1 illustrated in FIG. 6, and therefore the explanation thereof is omitted in this example and the differences therefrom will be explained below.

The plugs 218 are provided between the memory pillars MP and the step portion STP. The plugs 218 penetrate through the stack 20 in the Z-axis direction in the dummy cell region A3. The plugs 218 can be electrically insulated from the stack 20 by forming an insulator on the side surfaces of the plugs 218. In the dummy cell region A3, the plugs 218 are electrically connected to the peripheral circuit 110 via the conductive layer 219, the conductive layer 220, the conductive layer 222, the conductive layer 206, the conductive layer 205, the conductive layer 204, the conductive layer 203, the conductive layer 202, and the conductive layer 201.

The connection part 233a is provided between the substrate part 210a of the substrate 210 and the insulation separator VZ. The connection part 233a is provided on the plugs 218 in the dummy cell region A3. Thus, the conductive layer 233 is electrically connected to the plugs 218, and electrically connected to the peripheral circuit 110 via the plugs 218, the conductive layer 219, the conductive layer 220, conductive layer 222, the conductive layer 206, the conductive layer 205, the conductive layer 204, the conductive layer 203, the conductive layer 202, and the conductive layer 201.

The pad part 233b extends from the connection part 233a to the upper side of the memory cell region A1. The pad part 233b is exposed from the insulation layer 234, the insulation layer 235, and the insulation layer 236.

The insulation separator VZ overlaps with the stack 20 but does not overlap with the step portion STP in the dummy cell region A3. The insulation separator VZ does not overlap with the dummy memory pillars DMP in the dummy cell region A3. For example, in the method of manufacturing the memory 1 in the first example, the insulation separator VZ is provided by forming the opening H2 illustrated in FIG. 12 so as to overlap with the step portion STP, and then forming the insulation layer 232 in the opening H2.

The sixth example of the memory 1 has a structure in which the pad part of the bonding pad PD overlaps with the memory cell region A1 of the memory cell array 10 in the Z-axis direction. This can reduce the chip area. Further, in the sixth example of the memory 1, the connection part 233a is formed to overlap with the dummy cell region A3 and the insulation separator VZ is formed to overlap with the dummy cell region A3. Even if the regions R1 including the memory cell arrays 10 are formed, the above structure including the insulation separator VZ enables electrically insulating the regions R1 from one another to prevent cracks of the substrate 210. Further, the formation of the plurality of bonding pads PD can omit the insulation separator for electrically insulating the plurality of bonding pads PD from one another to prevent the interference with the insulation separator VZ.

The sixth example of the memory 1 can be appropriately combined with other examples of the memory 1.

Seventh Example of Memory 1

Figure 29:
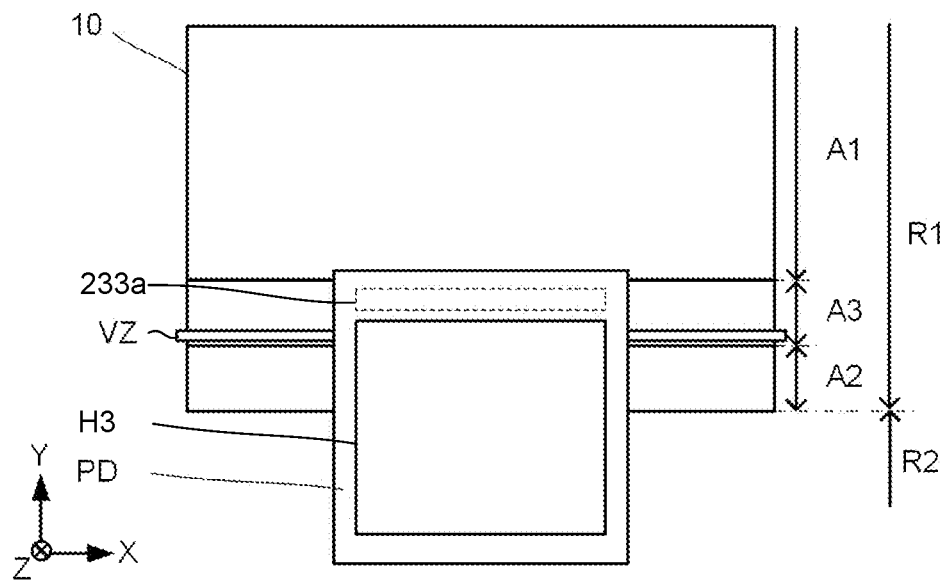
FIG. 29 is a planar schematic view illustrating a part of the chip 1B in a seventh example of the memory 1.
Figure 30:
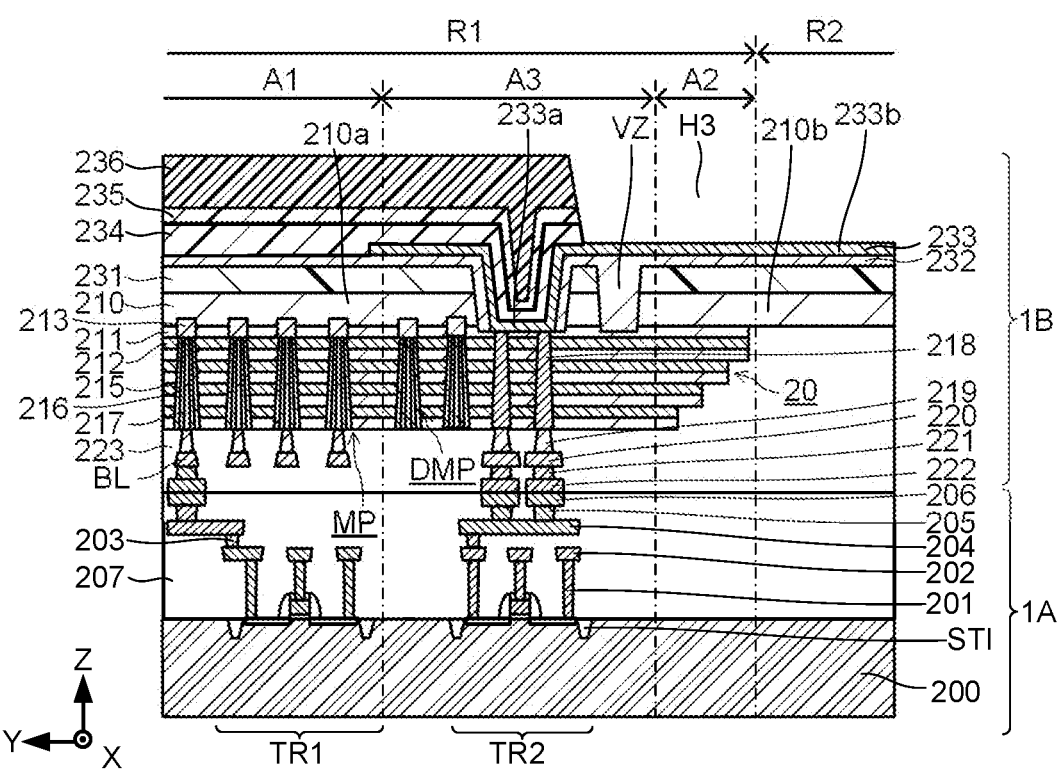
FIG. 30 is a cross-sectional schematic view for explaining a cross-sectional structure example of the seventh example of the memory 1.

A seventh example of the memory 1 will be explained referring to FIG. 29 and FIG. 30. FIG. 29 is a planar schematic view illustrating a part of the chip 1B in the seventh example of the memory 1. FIG. 30 is a cross-sectional schematic view for explaining a cross-sectional structure example of the seventh example of the memory 1, and illustrates an X-axis direction along the surface of the substrate 200, a Y-axis direction along the surface and substantially perpendicular to the X-axis, and a Z-axis direction substantially perpendicularly intersecting with the surface. The explanation of the same as those in the sixth example is omitted in this example, and the differences from those in the sixth example will be explained below.

As compared with the sixth example of the memory 1, the seventh example of the memory 1 is different in that the pad part 233b overlaps with the insulation separator VZ and overlaps with the substrate part 210b in the Z-axis direction. The rest of the memory 1 has the same structures as those in the memory 1 illustrated in FIG. 26, and therefore the explanation thereof is omitted in this example and the differences therefrom will be explained below.

The pad part 233b extends from the connection part 233a to the region R2. The pad part 233b is exposed from the insulation layer 234, the insulation layer 235, and the insulation layer 236.

The insulation separator VZ overlaps with the stack 20 and the pad part 233b in the dummy cell region A3 in the Z-axis direction. The insulation separator VZ does not overlap with the dummy memory pillars DMP in the dummy cell region A3. For example, in the method of manufacturing the memory 1 in the first example, the insulation separator VZ is provided by forming the opening H2 illustrated in FIG. 12 so as to overlap with the step portion STP, and then forming the insulation layer 232 in the opening H2.

The seventh example of the memory 1 has a structure in which the pad part of the bonding pad PD overlaps with the dummy step region A2 and the dummy cell region A3 of the memory cell array 10 in the Z-axis direction. This can reduce the chip area. Further, in the seventh example of the memory 1, the connection part 233a is formed to overlap with the dummy cell region A3 and the insulation separator VZ is formed to overlap with the dummy cell region A3. Even if the plurality of regions R1 including the memory cell arrays 10 are formed, the above structure including the insulation separator VZ enables electrically insulating the regions R1 from one another to prevent cracks of the substrate 210. Further, the formation of the plurality of bonding pads PD can omit the insulation separator for electrically insulating the plurality of bonding pads PD from one another to prevent the interference with the insulation separator VZ.

The seventh example of the memory 1 can be appropriately combined with other examples of the memory 1.

While certain embodiments of the present invention have been described above, these embodiments have been presented by way of example only, and are not intended to limit the scope of the invention. Indeed, the novel embodiments described herein may be embodied in a variety of other forms; furthermore, various omissions, substitutions and changes may be made without departing from the spirit of the inventions. The accompanying claims and their equivalents are intended to cover such forms or modifications as would fall within the scope and spirit of the inventions.

What is claimed is:

1. A semiconductor memory device, comprising:
a first substrate;
a peripheral circuit provided on the first substrate;
a stack provided above the peripheral circuit and including first conductive layers and first insulation layers, each first conductive layer and each first insulation layer being alternately stacked in a first direction;
a first pillar penetrating through the stack in the first direction and including a semiconductor layer, the semiconductor layer and the each first conductive layer forming a memory cell at an intersection therebetween;
a second substrate including a first region and a second region, the first region being provided above the stack and the first pillar and being electrically connected to the semiconductor layer, and the second region being juxtaposed with the first region in a second direction intersecting with the first direction;
a second insulation layer penetrating through the second substrate in the first direction, extending in a third direction intersecting with the first direction and with the second direction, and electrically insulating the first and second regions from each other; and
a second conductive layer including a first portion and a second portion, the first portion penetrating through the second substrate in the first direction, the second portion extending in the second direction above the second substrate, and the second portion including a part defining a bonding pad,
the second portion overlapping with the second insulation layer in the first direction.

2. The device according to claim 1, wherein:
the stack includes a step portion provided at an end portion of the stack in the second direction, the each first conductive layer and the each second conductive layer being stacked in tiers; and
the semiconductor memory device further comprises a second pillar, the second pillar penetrating through the stack in the first direction, being provided between the first pillar and the step portion, and being electrically insulated from the peripheral circuit.

3. The device according to claim 2, wherein
the second insulation layer does not overlap with the stack in the first direction.

4. The device according to claim 2, wherein
the second insulation layer overlaps with the step portion in the first direction.

5. The device according to claim 2, further comprising
a plug extending in the first direction and electrically connecting the first portion and the peripheral circuit, wherein
the first portion overlaps with the step portion in the first direction.

6. A semiconductor memory device, comprising:
a first substrate;
a peripheral circuit provided on the first substrate;
a stack provided above the peripheral circuit and including first conductive layers and first insulation layers, each first conductive layer and each first insulation layer being alternately stacked in a first direction;
a first pillar penetrating through the stack in the first direction and including a semiconductor layer, the semiconductor layer and the each first conductive layer forming a memory cell at an intersection therebetween;
a second substrate including a first region and a second region, the first region being provided above the stack and the first pillar and being electrically connected to the semiconductor layer, and the second region being juxtaposed the first region in a second direction intersecting with the first direction;

a second insulation layer penetrating through the second substrate in the first direction, extending in a third direction intersecting with the first direction and the second direction, and electrically insulating the first region from the second region; and a second conductive layer including a first portion and a second portion, the first portion penetrating through the second substrate in the first direction, the second portion extending in the second direction above the second substrate, and the second portion including a part defining a bonding pad, the first portion being provided between the first region and the second insulation layer.

7. The device according to claim 6, wherein:

the stack includes a step portion provided at an end portion of the stack in the second direction, the each first conductive layer and the each second conductive layer being arranged in tiers; and the semiconductor memory device further comprises a second pillar, the second pillar penetrating through the stack in the first direction, being provided between the first pillar and the step portion, and being electrically insulated from the peripheral circuit.

8. The device according to claim 7, further comprising a plug extending in the first direction and electrically connecting the first portion and the peripheral circuit, wherein:

the first portion overlaps with the step portion in the first direction; and the second insulation layer does not overlap with the step portion in the first direction.

9. The device according to claim 7, further comprising a plug extending in the first direction and electrically connecting the first portion and the peripheral circuit, wherein:

the plug is provided between the first pillar and the step portion; and the second insulation layer overlaps with the step portion in the first direction.

10. The device according to claim 7, further comprising a plug extending in the first direction and electrically connecting the first portion and the peripheral circuit, wherein:

the plug is provided between the first pillar and the step portion; and the second insulation layer overlaps with the stack in the first direction but does not overlap with the step portion.

11. The device according to claim 7, further comprising a plug extending in the first direction and electrically connecting the first portion and the peripheral circuit, wherein:

the plug is provided between the first pillar and the step portion; and the second portion overlaps with the second region in the first direction.

\* \* \* \* \*